United States Patent
Iida et al.

(10) Patent No.: US 12,319,566 B2
(45) Date of Patent: Jun. 3, 2025

(54) PHOTOTHERMAL CONVERSION ELEMENT, METHOD OF MANUFACTURING THE SAME, PHOTOTHERMAL POWER GENERATOR, AND MICROSCOPIC OBJECT COLLECTION SYSTEM

(71) Applicant: University Public Corporation Osaka, Osaka (JP)

(72) Inventors: Takuya Iida, Sakai (JP); Atsuko Kosuga, Sakai (JP); Shiho Tokonami, Sakai (JP)

(73) Assignee: University Public Corporation Osaka, Osaka (JP)

( * ) Notice: Subject to any disclaimer, the term of this patent is extended or adjusted under 35 U.S.C. 154(b) by 374 days.

(21) Appl. No.: 17/638,636

(22) PCT Filed: Aug. 28, 2020

(86) PCT No.: PCT/JP2020/032761
§ 371 (c)(1),
(2) Date: Feb. 25, 2022

(87) PCT Pub. No.: WO2021/040023
PCT Pub. Date: Mar. 4, 2021

(65) Prior Publication Data
US 2022/0324700 A1    Oct. 13, 2022

(30) Foreign Application Priority Data
Aug. 29, 2019    (JP) .................... 2019-157187

(51) Int. Cl.
*B81C 1/00*    (2006.01)
*B23K 26/352*    (2014.01)
(Continued)

(52) U.S. Cl.
CPC ...... *B81C 1/00055* (2013.01); *B23K 26/3584* (2018.08); *B81B 7/00* (2013.01);
(Continued)

(58) Field of Classification Search
None
See application file for complete search history.

(56) References Cited

U.S. PATENT DOCUMENTS

2015/0054903 A1*    2/2015    Liu .................. B82Y 40/00
347/171
2018/0185958 A1*    7/2018    Abdolvand .......... B23K 26/352
(Continued)

FOREIGN PATENT DOCUMENTS

CN    102242334 A    * 11/2011
JP    2009283783 A    12/2009
(Continued)

OTHER PUBLICATIONS

Vorobyev et al., Direct Femtosecond laser surface nano/microstructuring and its applications, Laser & Photonics Reviews, vol. 7, Issue 3, pp. 385-407, Aug. 2012 (Year: 2012).*
(Continued)

*Primary Examiner* — Geoffrey S Evans
(74) *Attorney, Agent, or Firm* — MARSHALL, GERSTEIN & BORUN LLP

(57) ABSTRACT

A method of manufacturing a photothermal conversion element includes preparing a solid material and forming a processed region processed by irradiation of the solid material with a laser beam. The forming includes grain refining the solid material to blacken the processed region.

5 Claims, 28 Drawing Sheets

(51) Int. Cl.
*B81B 7/00* (2006.01)
*H10N 10/13* (2023.01)
*H10N 10/17* (2023.01)
*H02N 11/00* (2006.01)

(52) U.S. Cl.
CPC ............ *H10N 10/13* (2023.02); *H10N 10/17* (2023.02); *B81B 2201/05* (2013.01); *B81B 2203/0323* (2013.01); *B81C 2201/0143* (2013.01); *H02N 11/00* (2013.01)

(56) References Cited

U.S. PATENT DOCUMENTS

2020/0006615 A1* 1/2020 Nakaya ................ H10N 10/856
2020/0182770 A1 6/2020 Tokonami et al.

FOREIGN PATENT DOCUMENTS

| JP | 2013028828 A | * | 2/2013 |
| JP | 2013-254940 A | | 12/2013 |
| JP | 2017-202446 A | | 11/2017 |
| KR | 20140046105 A | * | 4/2014 |
| WO | WO-2015/170758 A1 | | 11/2015 |
| WO | WO-2017/037876 A1 | | 3/2017 |
| WO | WO-2017/195872 A1 | | 11/2017 |
| WO | WO-2018159696 A1 | | 9/2018 |

OTHER PUBLICATIONS

Ou et al., The fluence threshold of femtosecond laser blackening of metals: the effect of laser induced ripples, Optics and Laser Technology, vol. 79 (Jan. 2016), pp. 79-87 (Year: 2016).*
Machine translation of CN-102242334-A, Mar. 2025 (Year: 2025).*
Machine translation of KR-20140046105-A, Mar. 2025 (Year: 2025).*
Extended European Search Report for corresponding European Application No. 20859390.5 dated Aug. 11, 2023.
Kosugo, A. et al., "A high performance photothermal film with spherical shell-type metallic nanocomposites for solar thermoelectric conversion," *Nanoscale*, pp. 7580-7584 (2015).
International Search Report issued in PCT Patent Application No. PCT/JP2020/032761 dated Oct. 20, 2020.
Kosuga, A. et al., "A high performance photothermal film with spherical shell-type metallic nanocomposites for solar thermoelectric conversion," *Nanoscale*, pp. 7580-7584 (2015).

* cited by examiner

FIG.4
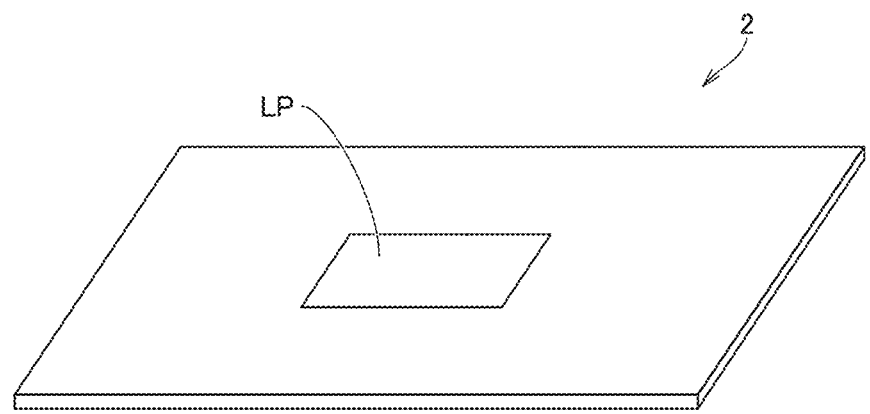
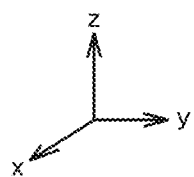

FIG.9

|  | LASER OUTPUT $P_{out}$ | SCANNING INTERVAL D | SPOT HEIGHT H |
|---|---|---|---|
| CONDITION 1A | 800 mW | 50 μm | 100 μm |
| CONDITION 1B | 800 mW | 50 μm | 50 μm |
| CONDITION 1C | 800 mW | 50 μm | 260 μm |
| CONDITION 1D | 800 mW | 50 μm | 180 μm |

FIG.15

|  | LASER OUTPUT $P_{out}$ | SCANNING INTERVAL D | SPOT HEIGHT H |
|---|---|---|---|
| CONDITION 2A | 400 mW | 50 $\mu$m | 0 $\mu$m |
| CONDITION 2B | 800 mW | 50 $\mu$m | 0 $\mu$m |
| CONDITION 2C | 800 mW | 50 $\mu$m | 50 $\mu$m |
| CONDITION 2D | 800 mW | 50 $\mu$m | 100 $\mu$m |
| CONDITION 2E | 800 mW | 100 $\mu$m | 100 $\mu$m |

FIG.16
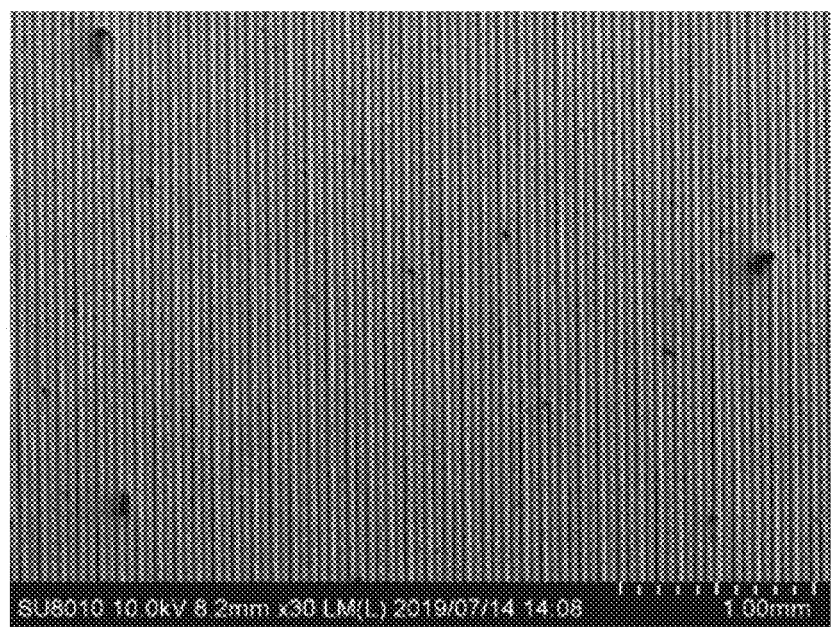
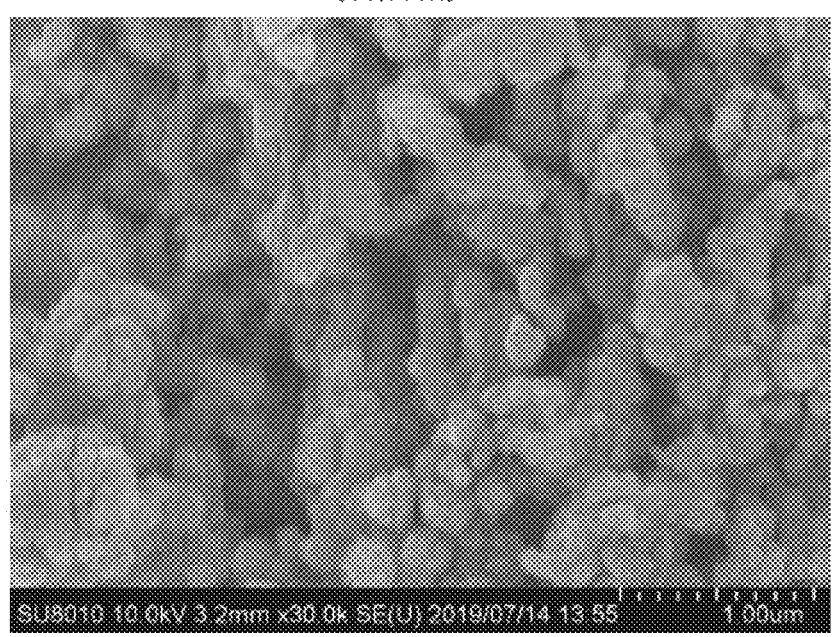

FIG.23
<SIZE>
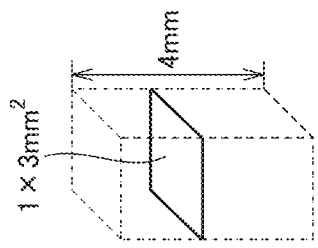
<THERMAL CONDITION>
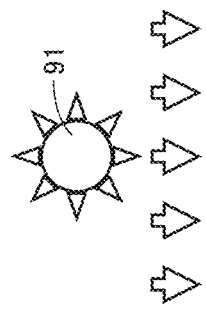
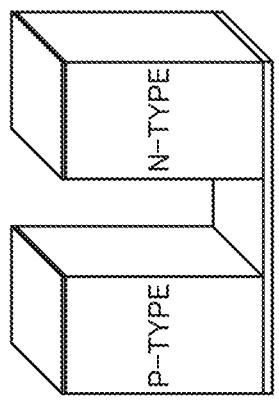
HEAT FLUX Q/S
TEMPERATURE = ROOM TEMPERATURE + TEMPERATURE INCREASE AMOUNT $T_{up}$
<MATERIAL CHARACTERISTICS>
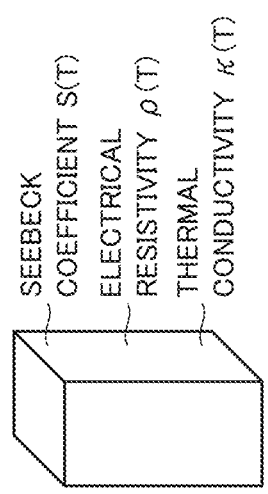
SEEBECK COEFFICIENT $S(T)$
ELECTRICAL RESISTIVITY $\rho(T)$
THERMAL CONDUCTIVITY $\kappa(T)$
ABSOLUTE TEMPERATURE T

PHOTOTHERMAL CONVERSION ELEMENT, METHOD OF MANUFACTURING THE SAME, PHOTOTHERMAL POWER GENERATOR, AND MICROSCOPIC OBJECT COLLECTION SYSTEM

TECHNICAL FIELD

The present disclosure relates to a photothermal conversion element, a method of manufacturing a photothermal conversion element, a photothermal power generator including a photothermal conversion element, and a microscopic object collection system including a photothermal conversion element.

BACKGROUND ART

A photothermal conversion element that converts white light such as sunlight into heat and utilizing the heat has recently attracted attention. For manufacturing a photothermal conversion element, a complicated method including chemical treatment is often used. Therefore, a technique for manufacturing a photothermal conversion element with a more simplified manufacturing method has been proposed.

For example, a photothermal conversion element disclosed in Japanese Patent Laying-Open No. 2013-254940 includes a plurality of metal nanoparticle assembly structure bodies and a substrate. Each of the plurality of metal nanoparticle assembly structure bodies is formed by assembly of a plurality of metal nanoparticles. The substrate includes a fixed surface where a plurality of metal nanoparticle assembly structure bodies are fixed. The fixed surface has a region where a plurality of metal nanoparticle assembly structure bodies are densely provided.

A photothermal conversion element that converts light into heat is required to be able to convert light into heat as efficiently as possible. Furthermore, manufacturing of such a photothermal conversion element with a simplified manufacturing method is demanded.

The present disclosure was made to meet the requirements above, and an object of the present disclosure is to provide a photothermal conversion element capable of highly efficiently converting light into heat. Another object of the present disclosure is to provide a simplified method of manufacturing a photothermal conversion element.

SUMMARY OF INVENTION

1) A method of manufacturing a photothermal conversion element according to one aspect of the present disclosure includes preparing a solid material and forming a processed region processed by irradiation of the solid material with a laser beam. The forming includes grain refining the solid material to blacken the processed region.

(2) The forming includes scanning with the laser beam to provide by cutting, a microgroove in the processed region.

(3) The solid material includes at least one of a thermoelectric material that exhibits a thermoelectric effect and a metal thin film.

(4) A photothermal conversion element according to another aspect of the present disclosure includes a solid material. The solid material includes a region blackened by dispersion of a plurality of fine particles composed of the solid material. The plurality of fine particles produce localized surface plasmon resonance on a surface of each of the plurality of fine particles by irradiation with light.

(5) The solid material includes at least one of a thermoelectric material that exhibits a thermoelectric effect and a metal thin film.

(6) A photothermal power generator according to yet another aspect of the present disclosure is capable of supplying generated electric power to a load. The photothermal power generator includes a photothermal conversion element and a thermoelectric converter that converts heat to electricity, the thermoelectric converter being thermally connected to the photothermal conversion element. The thermoelectric converter includes a P-type thermoelectric element, a first electrode electrically connected to a low-temperature side of the P-type thermoelectric element, an N-type thermoelectric element, and a second electrode electrically connected to a low-temperature side of the N-type thermoelectric element. The first electrode and the second electrode are connected to the load.

(7) The photothermal conversion element and one of the P-type thermoelectric element and the N-type thermoelectric element integrally form a photothermal conversion thermoelectric element.

(8) A photothermal conversion element according to yet another aspect of the present disclosure includes a substrate and a metal thin film arranged on the substrate. The metal thin film includes a region blackened by collection of a plurality of fine particles composed of a material of the metal thin film. The plurality of fine particles produce localized surface plasmon resonance on a surface of each of the plurality of fine particles by irradiation with light.

(9) A microscopic object collection system according to yet another aspect of the present disclosure collects a plurality of microscopic objects contained in a liquid. The microscopic object collection system includes a holder configured to hold a photothermal conversion element and a light source that emits the light that produces localized surface plasmon resonance on a surface of each of a plurality of fine particles. The light source has the plurality of microscopic objects collected by producing convection in the liquid held on the region by irradiation of a region with the light.

(10) The liquid is held on an upper surface of the region. The light from the light source is emitted upward from below the region. A thickness of a metal thin film is set such that the region is transmissive to the light from the light source.

According to the present disclosure, a photothermal conversion element capable of highly efficiently converting light into heat can be provided. Furthermore, according to the present disclosure, such a photothermal conversion element can readily be manufactured.

BRIEF DESCRIPTION OF DRAWINGS

FIG. 4 is a diagram showing a configuration of another photothermal conversion element according to the first embodiment.

FIG. 9 is a diagram showing a condition for laser processing of the photothermal conversion element in Example in the first embodiment.

FIG. 15 is a diagram showing a condition for laser processing of another photothermal conversion element in Example in the first embodiment.

FIG. 16 is a diagram showing an observation result of the photothermal conversion element in Example in the first embodiment.

FIG. 23 is a diagram for illustrating a condition for simulation of an amount of electric power generated by photothermal conversion and thermoelectric conversion in the photothermal power generator.

DESCRIPTION OF EMBODIMENTS

Figure 1:
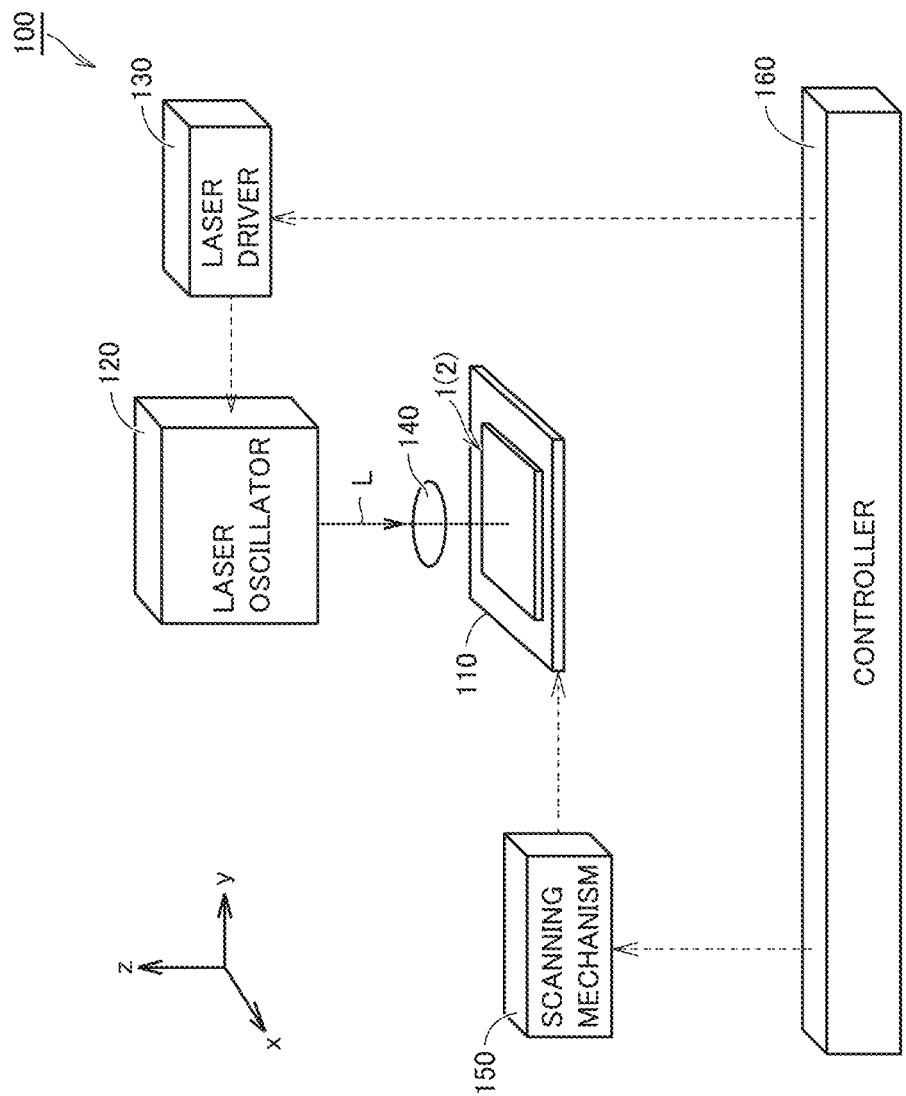
FIG. 1 is a diagram schematically showing an overall configuration of a laser processing system in a first embodiment.

The present embodiment will be described in detail below with reference to the drawings. The same or corresponding elements in the drawings have the same reference characters allotted and description thereof will not be repeated.

Explanation of Terms

In the present disclosure and embodiments therein, a "thermoelectric material" refers to a material that exhibits a thermoelectric effect (Seebeck effect), and more specifically means a material having an absolute value of thermoelectromotive force at a room temperature (20° C.) greater than or equal to 50 [μV/K] and electrical resistivity (specific resistance) at the room temperature less than or equal to 100 [mΩ·cm]. Though materials having the absolute value of thermoelectromotive force greater than or equal to 50 [μV/K] may include an insulator, the insulator is excluded from the thermoelectric material based on the condition that the electrical resistivity is less than or equal to 100 [mΩ·cm]. Examples of the thermoelectric material include an alloy (specifically, constantan, a Heusler alloy, and a half Heusler alloy), silicide (iron silicide or the like), a metal, a semiconductor, and ceramics.

Constantan has the absolute value of thermoelectromotive force of approximately 75 [μV/K] and the electrical resistivity of approximately $4.8 \times 10^{-2}$ [mΩ·cm]. For comparison, gold has the absolute value of thermoelectromotive force of approximately 1.94 [μV/K] and the electrical resistivity of approximately $2.4 \times 10^{-3}$ [mΩ·cm].

In the present disclosure and embodiments therein, "fine particles" mean particles having a size within a range from the nanometer order to the micrometer order. A shape of the fine particles is not limited to a spherical shape but a shape of an oval sphere or a rod shape may be applicable. Examples of fine particles include a metal nanoparticle, a metal microparticle, a semiconductor nanoparticle, a semiconductor microparticle, a metal nanoparticle assembly, an assembly of a metal nanoparticle and a metal microparticle, and an assembly of a semiconductor nanoparticle and a semiconductor microparticle.

In the present disclosure and embodiments therein, a "microscopic object" means a substance having a size within the range from the nanometer order to the micrometer order. A shape of the microscopic object is not limited to a spherical shape but a shape of an oval sphere or a rod shape may be applicable. When the microscopic object is in the shape of the oval sphere, at least one of a length in a direction of a major axis and a length in a direction of a minor axis of the oval sphere should only be within the range from the nanometer order to the micrometer order. When the microscopic object is in the rod shape, at least one of a width and a length of the rod should only be within the range from the nanometer order to the micrometer order. Examples of microscopic objects include a metal nanoparticle, a metal nanoparticle assembly, a metal nanoparticle assembly structure, a semiconductor nanoparticle, an organic nanoparticle, a resin bead, and a particulate matter (PM).

The "metal nanoparticle" refers to a metal particle having a size of the nanometer order. The "metal microparticle" refers to a metal particle having a size of the micrometer order. The "metal nanoparticle assembly" refers to an assembly formed by aggregation of a plurality of metal nanoparticles. The "metal nanoparticle assembly structure body" refers, for example, to a structure body in which a plurality of metal nanoparticles are fixed to a surface of a bead with an interactive site being interposed and arranged at intervals not larger than a diameter of each metal nanoparticle with gaps being interposed thereamong. The "semiconductor nanoparticle" refers to a semiconductor particle having a size of the nanometer order. The "semiconductor microparticle" refers to a semiconductor particle having a size of the micrometer order. The "organic nanoparticle" refers to a particle composed of an organic compound and having a size of the nanometer order. The "resin bead" refers to a particle composed of a resin and having a size within the range from the nanometer order to the micrometer order. The "PM" refers to a particulate substance having a size of the micrometer order.

The microscopic object may be a biologically originated substance (a biological substance). More specifically, the microscopic object may include cells, microorganisms (bacteria, fungi, etc.), a biopolymer (protein, nucleic acid, lipid, polysaccharide, etc.), an antigen (allergen etc.), and a virus.

In the present disclosure and embodiments therein, a "microgroove" means a groove having a width of the micrometer order. When a plurality of microgrooves are provided by cutting, an interval between one groove and a groove adjacent thereto is also preferably of the micrometer order. A shape of the microgroove is not limited to a linear shape and a curved shape may be applicable. The microgroove may include a portion where one groove is branched into a plurality of grooves or a portion where a plurality of grooves merge into one groove. The microgroove may be provided in a form of a dashed line.

In the present disclosure and embodiments therein, a "nanometer order" includes a range from 1 nm to 1,000 nm (=1 μm). A "micrometer order" includes a range from 1 μm to 1,000 μm (=1 mm). Therefore, a "range from the nanometer order to the micrometer order" includes a range from 1 nm to 1,000 μm. The "range from the nanometer order to the micrometer order" may typically represent a range from several nanometers to several hundred micrometers, preferably a range from 100 nm to 100 μm, and more preferably a range from 1 μm to several tens of micrometers.

In the present disclosure and embodiments therein, "white light" means light within a wavelength range from an ultraviolet range to a near infrared range (for example, a wavelength range from 200 nm to 1100 nm). White light may be continuous light or pulsed light.

In the present disclosure and embodiments therein, "being transmissive to light" means a such a property that intensity of light that passes through a substance is higher than zero. When light passes through a substance, energy of remaining light may be absorbed, scattered, or reflected by that substance. A wavelength range of light may be any of an ultraviolet range, a visible range, and a near infrared range, a range over two of these three ranges, and a range over all of the three ranges. Light transmissivity can be defined, for example, by a range of transmittance. In this case, a lower limit of the range of transmittance should only be higher than 0 and not particularly limited.

The term "microbubble" in the present disclosure and embodiments therein means an air bubble of the micrometer order.

First Embodiment

In a first embodiment, two types of photothermal conversion elements 1 and 2 and a method of manufacturing the same will be described. Photothermal conversion elements 1 and 2 according to the first embodiment are made by using a laser processing system. An x direction and a y direction represent a horizontal direction below. The x direction and the y direction are orthogonal to each other. A z direction represents a vertical direction. An orientation of the gravity is downward in the z direction.

Configuration of Laser Processing System

FIG. 1 is a diagram schematically showing an overall configuration of a laser processing system in the first embodiment. Referring to FIG. 1, a laser processing system 100 includes an XYZ-axis stage 110, a laser oscillator 120, a laser driver 130, an objective lens 140, a scanning mechanism 150, and a controller 160.

XYZ-axis stage 110 is configured to hold photothermal conversion element 1 (or photothermal conversion element 2). Configurations of photothermal conversion elements 1 and 2 will be described with reference to FIGS. 2 to 5.

Laser oscillator 120 emits pulsed a laser beam L. For example, femtosecond laser that emits ultra-short pulsed light can be employed as laser oscillator 120. Specific examples of such laser oscillator 120 include Ti:sapphire laser. Ti:sapphire laser emits light having a wavelength within the near infrared range (a wavelength within a range from 650 nm to 1,100 nm, and for example, a central wavelength of 1,040 nm).

Laser driver 130 supplies a drive current to laser oscillator 120 and controls characteristics (specifically, laser output, a pulse width, and a repetition frequency) of pulsed laser beam L emitted from laser oscillator 120 in accordance with an instruction from controller 160.

Objective 140 focuses pulsed laser beam L from laser oscillator 120. Light focused by objective lens 140 is emitted to photothermal conversion element 1 yet to be processed or being processed that is held on XYZ-axis stage 110.

Scanning mechanism 150 is configured to adjust a position in the x direction, the y direction, and the z direction of XYZ-axis stage 110 in accordance with an instruction from controller 160. In the present embodiment, scanning mechanism 150 initially sets a distance (a spot height H of pulsed laser beam L which will be described later) between objective lens 140 and photothermal conversion element 1 held on XYZ-axis stage 110. Then, scanning mechanism 150 has photothermal conversion element 1 scanned with pulsed laser beam L by adjusting the position in the x direction and the y direction of XYZ-axis stage 110 while it maintains spot height H constant.

In the example shown in FIG. 1, photothermal conversion element 1 is scanned with pulsed laser beam L by being moved while a position of irradiation with pulsed laser beam L is fixed. In contrast, the position of irradiation with pulsed laser beam L may be moved with respect to fixed photothermal conversion element 1.

Controller 160 is implemented by a microcomputer including a processor such as a central processing unit (CPU), a memory such as a read only memory (ROM) and a random access memory (RAM), and an input and output port, although none of them is shown. Controller 160 controls each device (laser driver 130 and scanning mechanism 150) within laser processing system 100. Specifically, controller 160 sets a condition for irradiation with pulsed laser beam L (a laser processing condition) and provides to laser driver 130, an instruction for performing processing in accordance with the laser processing condition. Controller 160 provides an instruction for scanning with pulsed laser beam L to scanning mechanism 150.

Figure 2:
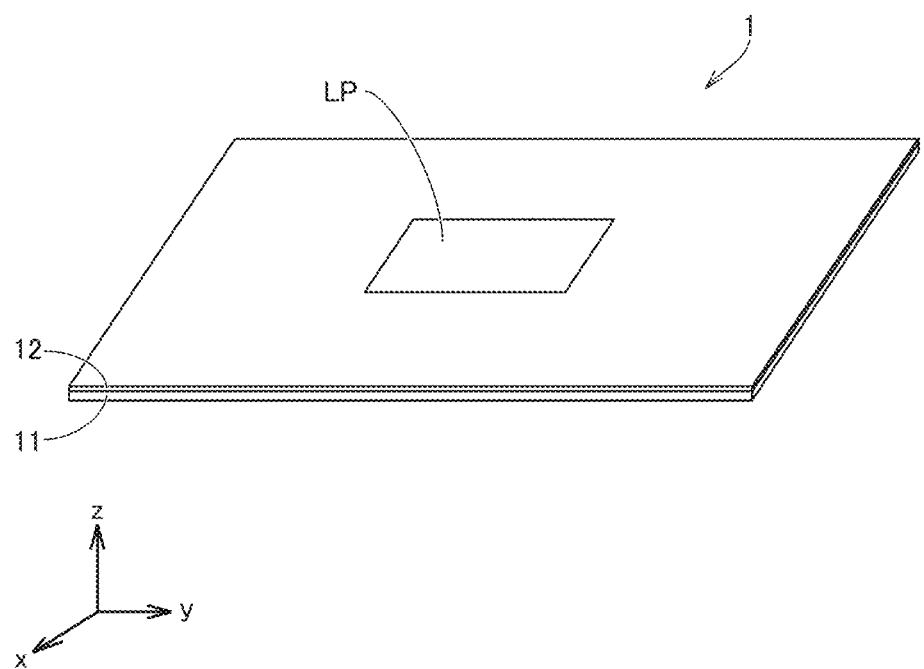
FIG. 2 is a diagram showing a configuration of a photothermal conversion element according to the first embodiment.

FIG. 2 is a diagram showing a configuration of photothermal conversion element 1 according to the first embodiment. Referring to FIG. 2, photothermal conversion element 1 includes a substrate 11 and a metal thin film 12 arranged on substrate 11.

Substrate 11 is formed of a material that does not affect photothermal conversion and thermoelectric conversion (which will be described later) and is transparent to pulsed laser beam L (near infrared rays in the present embodiment) from laser oscillator 120. Examples of such a material include quartz, silicone, and a resin film. In the present embodiment, a glass substrate (cover glass) is employed as substrate 11.

A material for metal thin film 12 is preferably high in photothermal conversion efficiency in a wavelength range of light (white light WL in an example which will be described later) emitted to metal thin film 12. In the example shown in FIG. 2, a gold thin film having a thickness of the nanometer order is formed as metal thin film 12. The gold thin film can be formed on the glass substrate by using a known method such as sputtering or electroless plating.

Metal thin film 12 does not have to be formed on the entire surface of substrate 11 but should only be formed on at least a part of substrate 11. The material for metal thin film 12 is not limited to gold, and silver or an alloy such as constantan that may achieve photothermal conversion may be applicable. Metal thin film 12 represents an exemplary "solid material" according to the present disclosure.

Metal thin film 12 includes a processed region LP processed by irradiation with pulsed laser beam L. Though details will be described later, processed region LP is a blackened region that contains gold nanoparticles formed by grain refining metal thin film 12 by irradiation with pulsed laser beam L (see FIG. 10).

Figure 3:
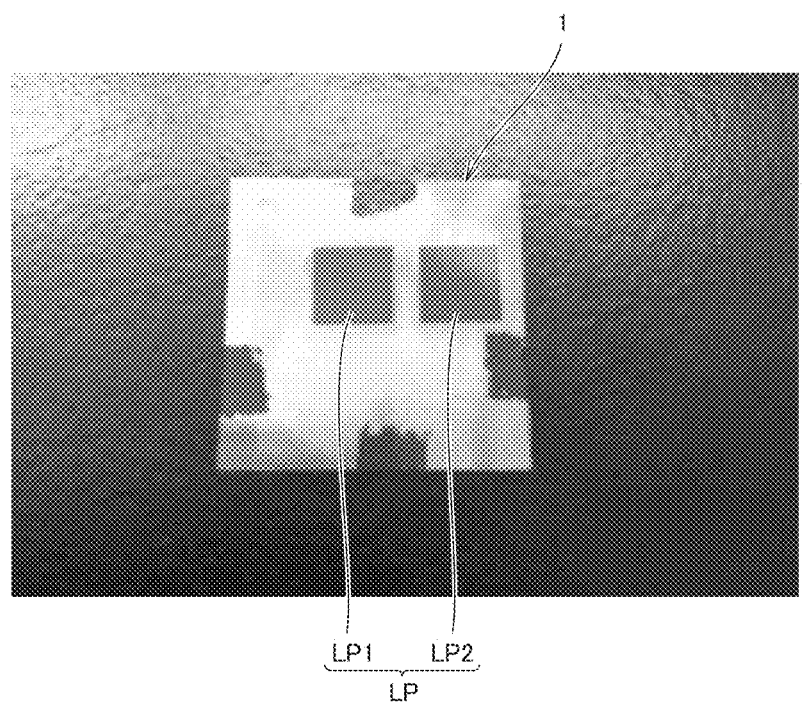
FIG. 3 shows a photograph of the made photothermal conversion element.

FIG. 3 shows a photograph of made photothermal conversion element 1. In the example shown in FIG. 3, photothermal conversion element 1 includes two processed regions LP (processed regions LP1 and LP2). The number of processed regions LP is thus not limited to one but may be set to any number larger than or equal to two. Processed region LP may be formed in only a part of metal thin film 12, or processed region LP may be formed on the entire surface by laser processing of the entire surface of metal thin film 12. A tape for fixing photothermal conversion element 1 is applied to top, bottom, left, and right parts of photothermal conversion element 1 in FIG. 3.

Figure 5:
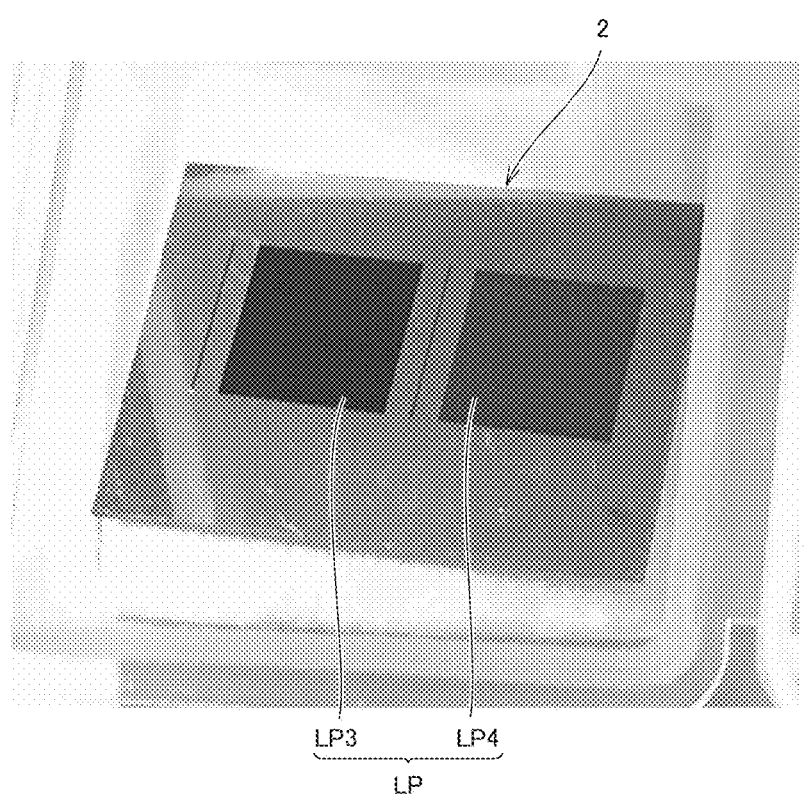
FIG. 5 shows a photograph of the made photothermal conversion element.

FIG. 4 is a diagram showing a configuration of another photothermal conversion element 2 according to the first embodiment. FIG. 5 shows a photograph of made photothermal conversion element 2. Referring to FIGS. 4 and 5, photothermal conversion element 2 may be made from a metal plate. In other words, substrate 11 as a base for forming metal thin film 12 is not essential. In this example, photothermal conversion element 2 is composed of a copper nickel alloy. In particular, constantan which is a copper alloy containing approximately 40% to 50% of nickel can be adopted. The metal plate composed of constantan or the like represents another exemplary "solid material" according to the present disclosure. The "solid material" may be another thermoelectric material that exhibits the thermoelectric effect.

Photothermal conversion element 2 includes processed region LP formed by irradiation of a metal material with pulsed laser beam L, similarly to metal thin film 12. In the photograph shown in FIG. 5, two blackened processed regions LP3 and LP4 are provided in photothermal conversion element 2.

Laser Processing Condition

A condition for irradiation with pulsed laser beam L (laser processing condition) for forming appropriate processed region LP will now be described. The laser processing condition is defined by three parameters. Since a method of setting each parameter is in common between photothermal conversion elements 1 and 2, the laser processing condition for photothermal conversion element 1 will representatively be described below.

Figure 6:
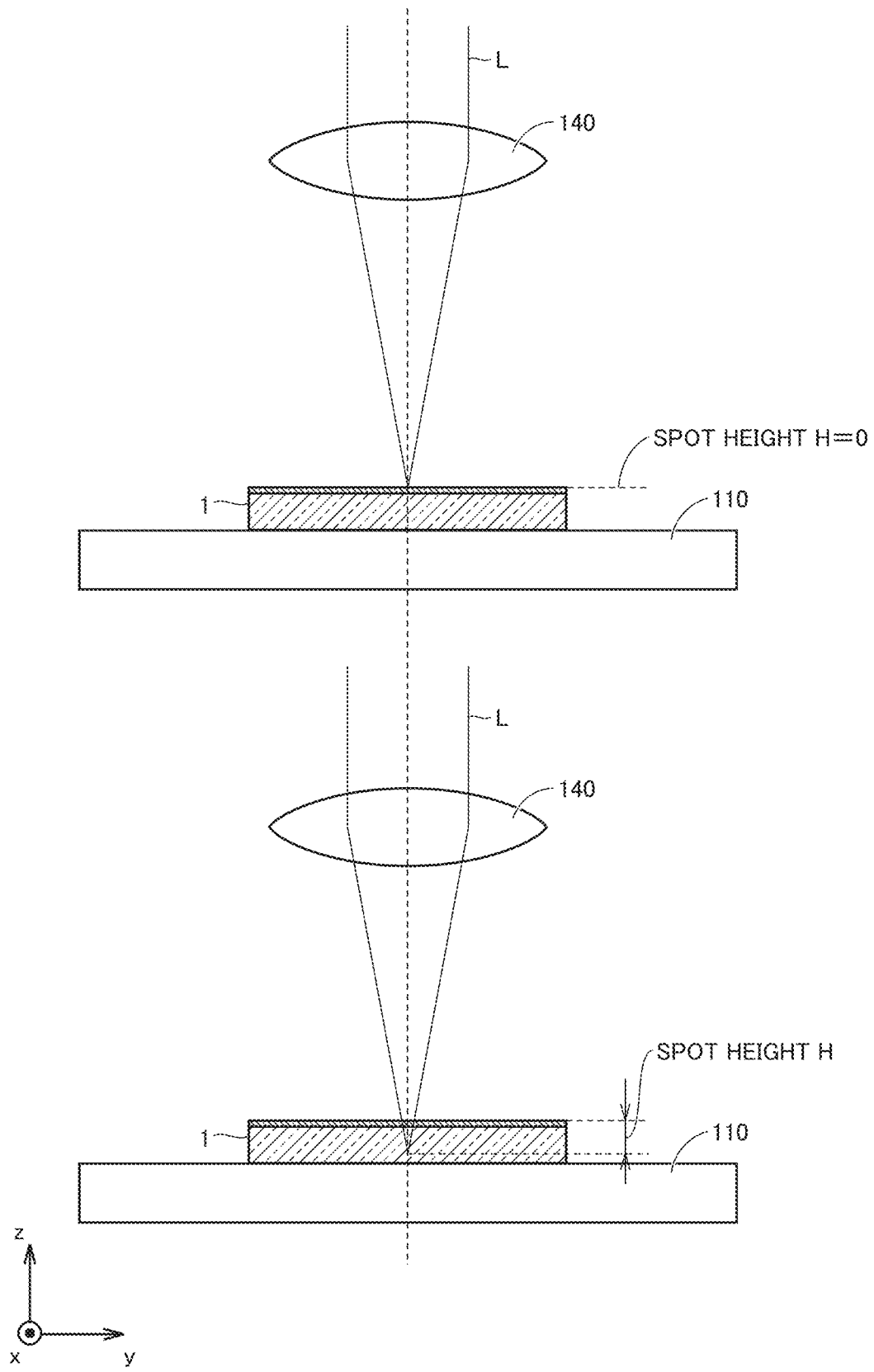
FIG. 6 is a first diagram for illustrating a condition for laser processing of the photothermal conversion element.

FIG. 6 is a first diagram for illustrating a condition for laser processing of photothermal conversion element 1. Referring to FIG. 6, a first parameter that defines the laser processing condition is spot height H [µm]. A spot size of pulsed laser beam L (a radius of pulsed laser beam L) is smallest at a position of a beam waist. Spot height H refers to a distance on an optical axis between the beam waist and an upper surface of photothermal conversion element 1 (in the example shown in FIG. 6, a surface of metal thin film 12) with the position of the beam waist being defined as the reference (H=0).

Figure 7:
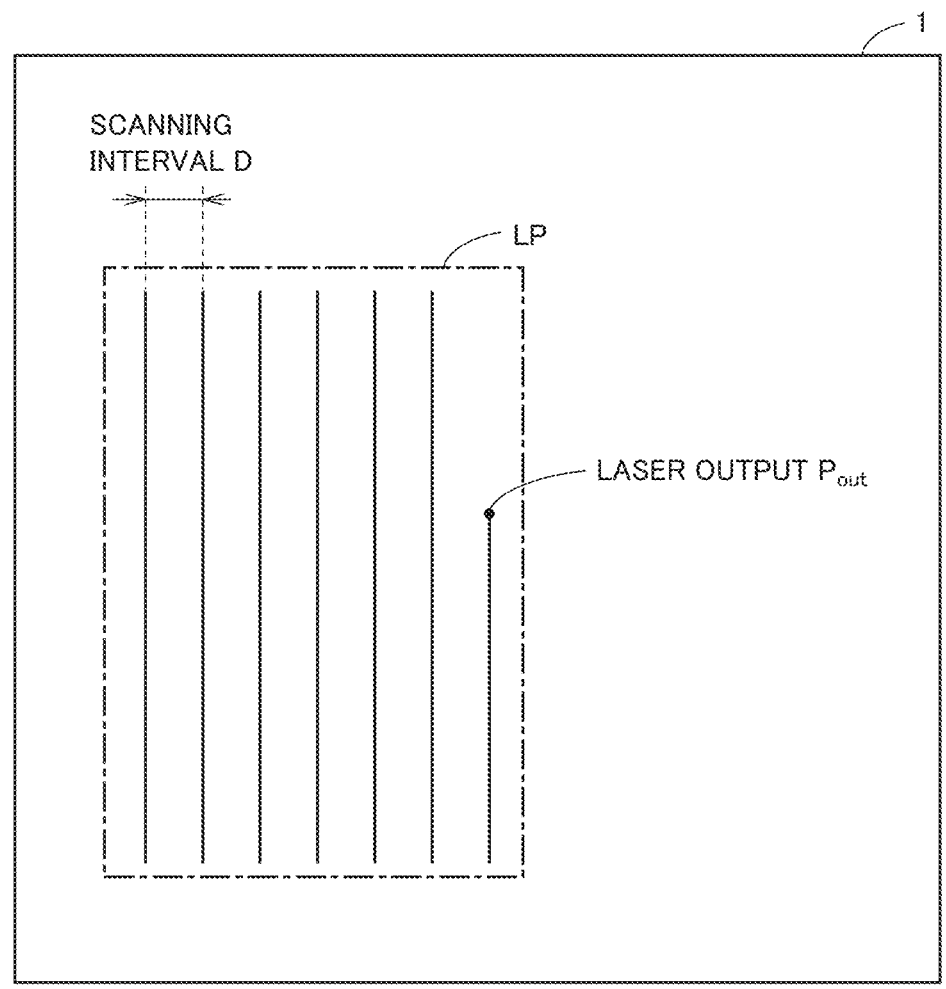
FIG. 7 is a second diagram for illustrating a condition for laser processing of the photothermal conversion element.

FIG. 7 is a second diagram for illustrating a condition for laser processing of photothermal conversion element 1. A second parameter that defines the laser processing condition is a scanning interval D [µm] of pulsed laser beam L. In the present embodiment, pulsed laser beam L is emitted such that a plurality of straight lines in parallel to one another are arranged at regular intervals. Scanning interval D refers to an interval between one straight line and another straight line adjacent thereto. Processed region LP where laser processing with pulsed laser beam L is performed has a size of several-millimeter square (6 mm×6 mm in an example which will be described later).

A third parameter that defines the laser processing condition is laser output $P_{out}$ [mW]. Laser output $P_{out}$ refers to output of pulsed laser beam L after passage through objective lens 140 (that is, a position of photothermal conversion element 1).

By combining as appropriate the three parameters of spot height H, scanning interval D, and laser output $P_{out}$, characteristics (optical characteristics and photothermal conversion characteristics) exhibited by processed region LP can be adjusted. A measurement result of characteristics of processed region LP will be described later in detail.

Flow of Manufacturing Photothermal Conversion Element

Figure 8:
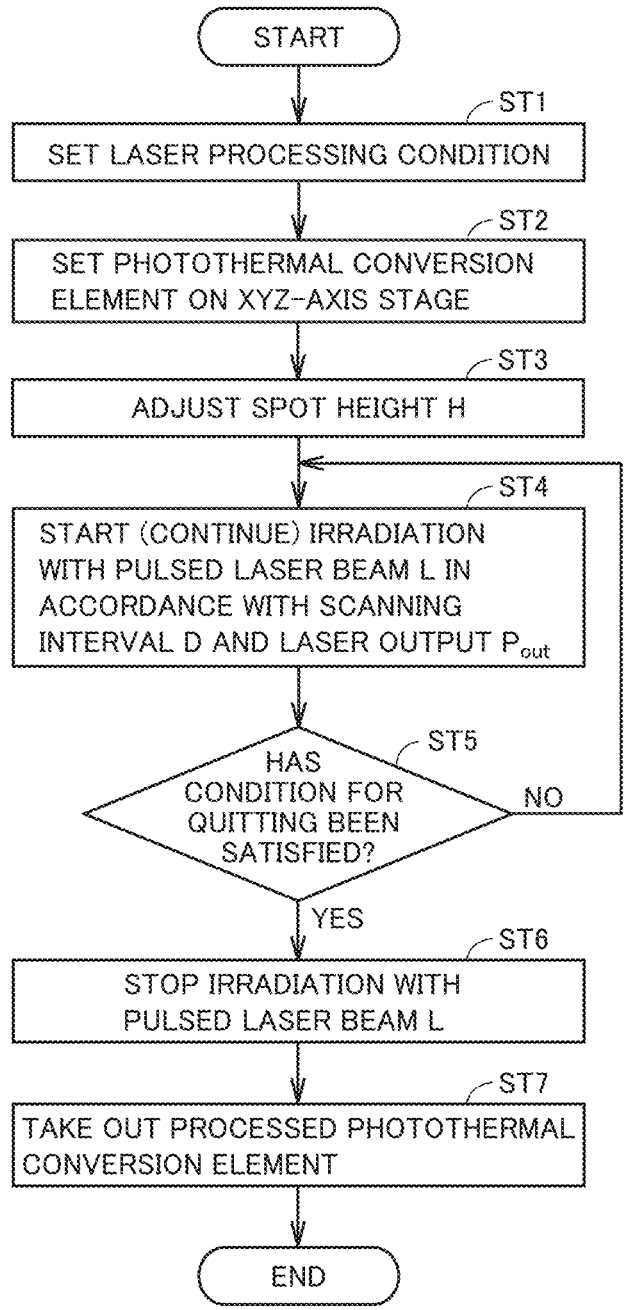
FIG. 8 is a flowchart showing a method of manufacturing a photothermal conversion element according to the first embodiment.

FIG. 8 is a flowchart showing a method of manufacturing photothermal conversion element 1 according to the first embodiment. This flowchart is performed when a prescribed condition is satisfied (for example, when a user operates a not-shown start button). Though each step included in this flowchart is basically performed by software processing by controller 160, a part or the entirety thereof may be performed by hardware (electric circuitry) made in controller 160. A step will be abbreviated as "ST" below.

Referring to FIG. 8, in ST1, controller 160 sets combination of the three parameters (spot height H, scanning interval D, and laser output $P_{out}$) as the laser processing condition. More specifically, in accordance with a type (a material and a thickness of metal thin film 12) and an application of photothermal conversion element 1, appropriate combination of the three parameters can be found by conducting experiments in advance. Therefore, controller 160 can select appropriate combination in accordance with the type and the application of photothermal conversion element 1 from among a plurality of combinations prepared in advance. Alternatively, controller 160 may accept an operation by a user to designate combination of the three parameters through a not-shown input device (a mouse or a keyboard).

In ST2, controller 160 has yet-to-be processed photothermal conversion element 1 set on XYZ-axis stage 110. This processing can be realized, for example, by a feed mechanism (not shown) of photothermal conversion element 1. Processing in ST2 corresponds to the "preparing" according to the present disclosure.

In ST3, controller 160 provides an instruction to scanning mechanism 150 and controls a height (a position in the z direction) of XYZ-axis stage 110. Controller 160 thus adjusts spot height H to the value set in ST1.

In ST4, controller 160 controls laser driver 130 to start (or continue) irradiation with pulsed laser beam L in accordance with the laser processing condition set in ST1. Controller 160 controls scanning mechanism 150 to carry out scanning with pulsed laser beam L in accordance with a scanning pattern set in advance. Processing in ST4 corresponds to the "making" according to the present disclosure.

In ST5, controller 160 determines whether or not a predetermined condition for quitting laser processing has been satisfied. Controller 160 determines that the condition for quitting laser processing has been satisfied at a time point of completion of drawing of the scanning pattern. When the condition has not been satisfied (NO in ST4), controller 160 has the process return to ST4. Irradiation with pulsed laser beam L is thus continued. When the condition has been satisfied (YES in ST5), controller 160 has the process proceed to ST6.

In ST6, controller 160 controls laser driver 130 to stop irradiation with pulsed laser beam L. Then, controller 160 controls the feed mechanism of photothermal conversion element 1 to take processed photothermal conversion element 1 out of XYZ-axis stage 110 (ST7). A series of processing thus ends.

Example in First Embodiment

An observation result and a measurement result of a spectrum of photothermal conversion elements 1 and 2 made with laser processing system 100 will now be described. An evaluation result of photothermal conversion element 1 (see FIGS. 2 and 3) in which a gold thin film formed on a glass substrate has been processed with laser will initially be described. In this example, the gold thin film has a thickness of 100 μm.

FIG. 9 is a diagram showing a condition for laser processing of photothermal conversion element 1 in Example in the first embodiment. Referring to FIG. 9, photothermal conversion element 1 described above was processed with laser in accordance with four conditions 1A to 1D shown in FIG. 9. Laser output $P_{out}$=800 mW and scanning interval D=50 μm were common among conditions 1A to 1D. Spot height H was different among conditions 1A to 1D. The pulse width of pulsed laser beam L was set to 400 fs and a repetition frequency of pulsed laser beam L was set to 100 kHz.

Figure 10:
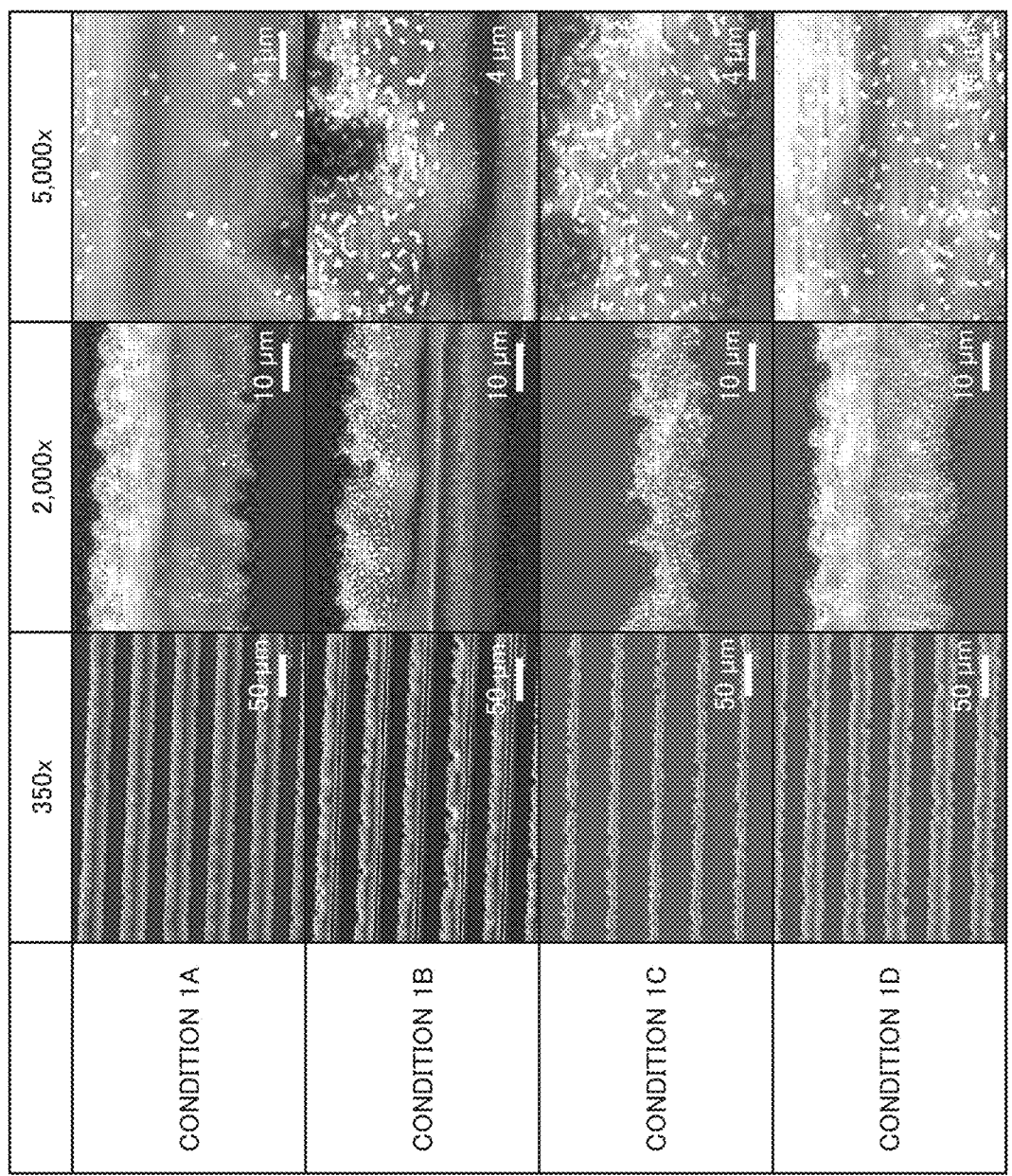
FIG. 10 is a diagram showing an observation result of the photothermal conversion element in Example in the first embodiment.

FIG. 10 is a diagram showing an observation result of photothermal conversion element 1 in Example in the first embodiment. FIG. 10 shows scanning electron microscope (SEM) images of photothermal conversion elements 1 manufactured in accordance with conditions 1A to 1D described with reference to FIG. 9. Referring to FIG. 10, in an image at a magnification of 350×, a region with a light color (a region between two black lines) is a region irradiated with pulsed laser beam L. In an image at a magnification of 2,000× or 5,000×, grain refined gold was observed in a microgroove formed by irradiation with pulsed laser beam L under any of conditions 1A to 1D. Most gold particles had a size (a diameter) within a range from several ten nanometers to several hundred nanometers, whereas some gold particles had a size of the micrometer order.

When gold nanoparticles (which may be gold microparticles) are irradiated with light having a specific wavelength, free electrons of the gold nanoparticles form surface plasmons and are oscillated by resonance light. Polarization thus occurs. Energy of this polarization is converted to energy of lattice vibration as a result of Coulomb interaction between free electrons and nuclei. Consequently, the gold nanoparticles generate heat. This effect is referred to as a "photothermal effect" below. By utilizing the photothermal effect of the gold nanoparticles, light over a wide band can be absorbed and can be converted into heat at high efficiency (see FIG. 22 which will be described later).

Figure 11:
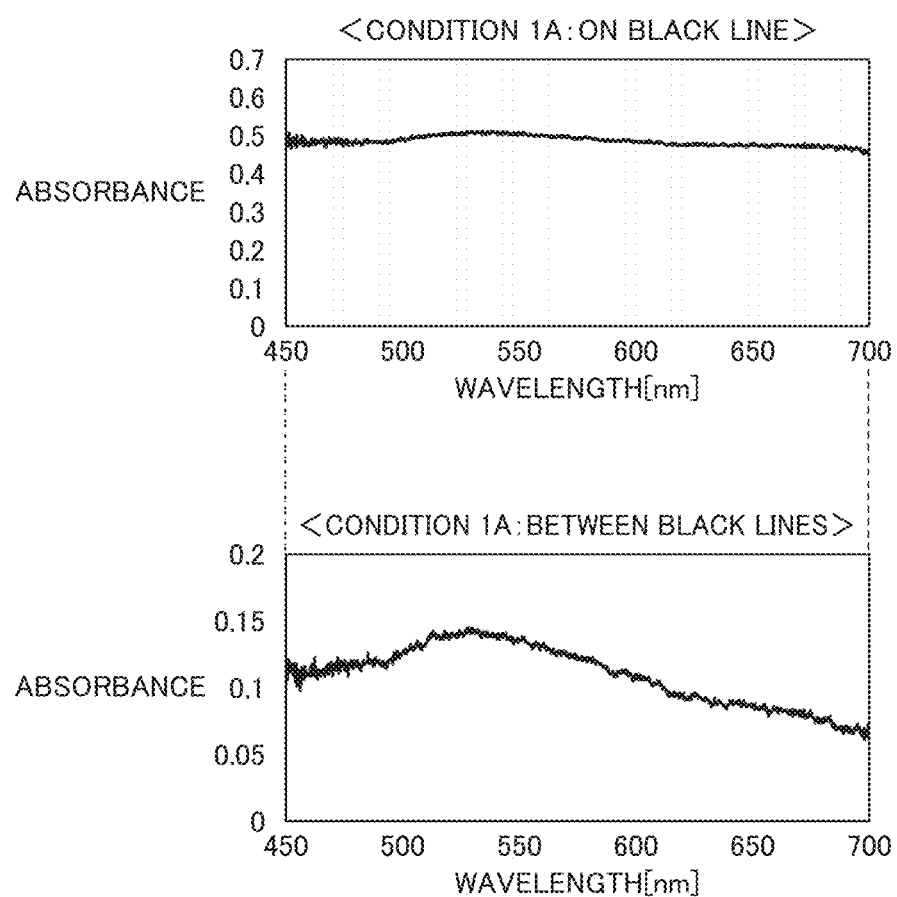
FIG. 11 is a diagram showing a measurement result of an absorbance spectrum of the photothermal conversion element manufactured under a condition 1A.
Figure 12:
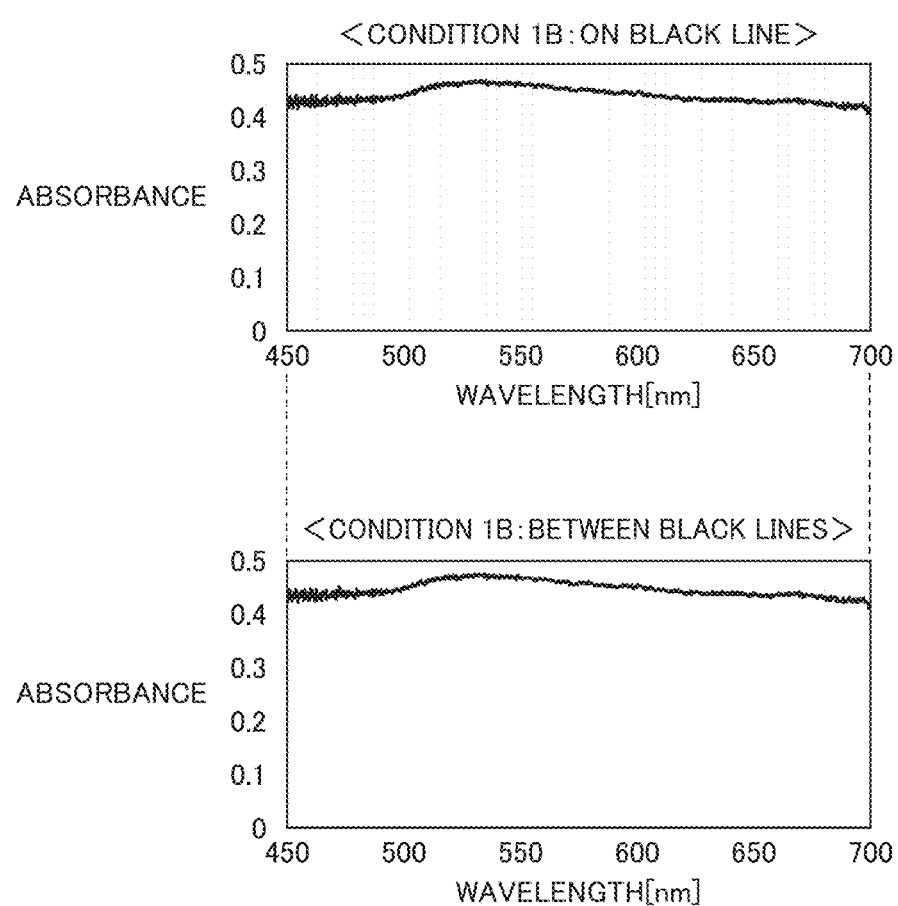
FIG. 12 is a diagram showing a measurement result of an absorbance spectrum of the photothermal conversion element manufactured under a condition 1B.
Figure 13:
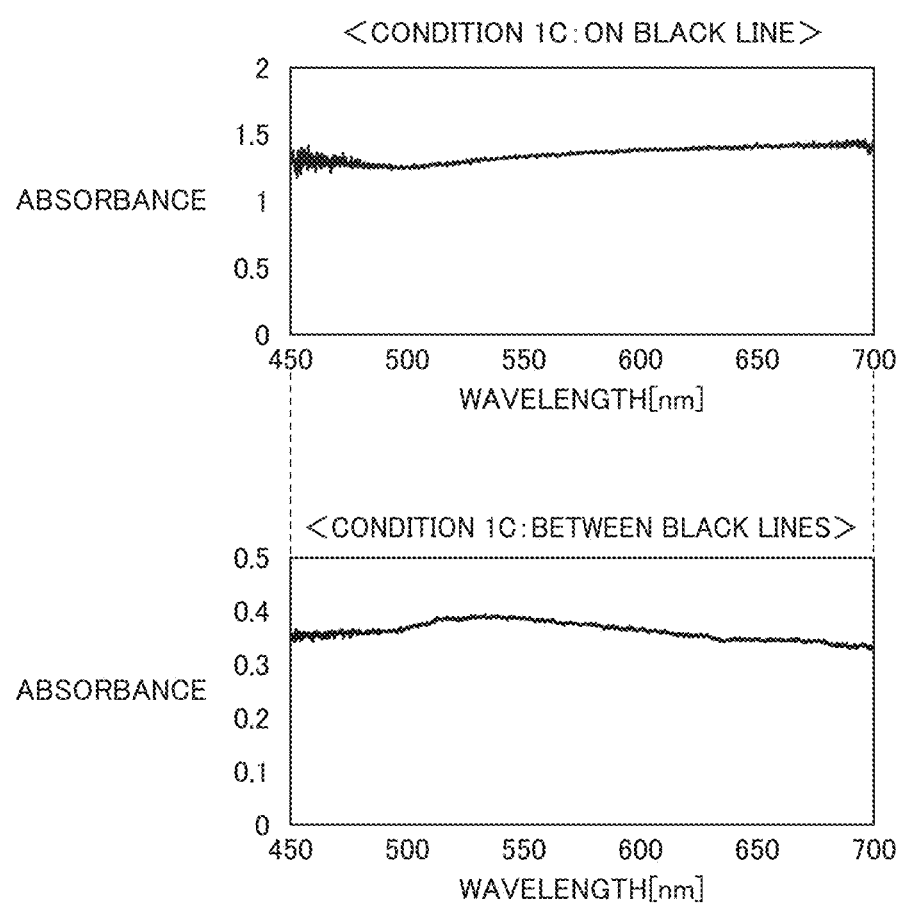
FIG. 13 is a diagram showing a measurement result of an absorbance spectrum of the photothermal conversion element manufactured under a condition 1C.
Figure 14:
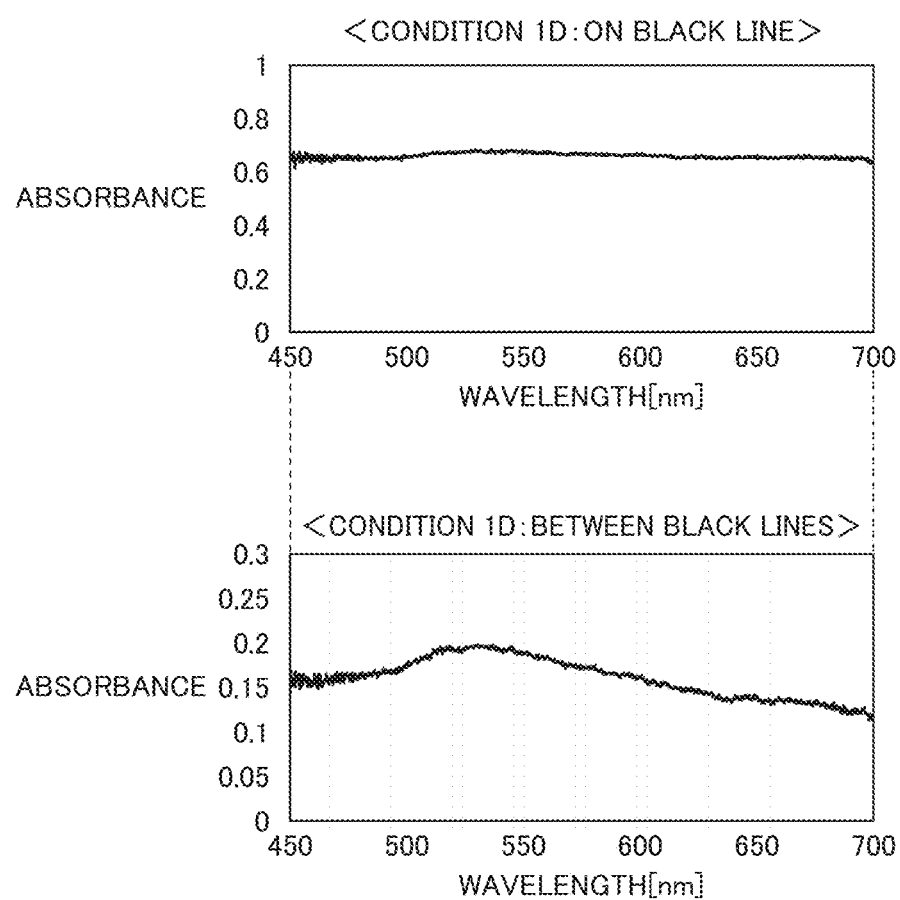
FIG. 14 is a diagram showing a measurement result of an absorbance spectrum of the photothermal conversion element manufactured under a condition 1D.

FIG. 11 is a diagram showing a measurement result of an absorbance spectrum of photothermal conversion element 1 manufactured under condition 1A. FIG. 12 is a diagram showing a measurement result of an absorbance spectrum of photothermal conversion element 1 manufactured under condition 1B. FIG. 13 is a diagram showing a measurement result of an absorbance spectrum of photothermal conversion element 1 manufactured under condition 1C. FIG. 14 is a diagram showing a measurement result of an absorbance spectrum of photothermal conversion element 1 manufactured under condition 1D.

In each of FIGS. 11 to 14, an upper row shows a result of local measurement of a spectrum in a region on the black line (a region not irradiated with pulsed laser beam L), and a lower row shows a result of local measurement of a spectrum in a region between black lines (a region where the gold nanoparticles were observed). In the region on the black line, a flat spectrum as in an unprocessed gold thin film was obtained. In contrast, in the region between the black lines, a broad spectrum was observed and a peak derived from localized surface plasmons of the gold nanoparticles was observed around a wavelength of 530 nm.

Thus, an absorbance spectrum in the region irradiated with pulsed laser beam L is broader and exhibits peak shift as compared with an absorbance spectrum in a region not irradiated with pulsed laser beam L or an absorbance spectrum obtained from a single metal nanoparticle. This change in spectrum indicates as below.

By using only a physical process (a non-chemical process) of irradiation with pulsed laser beam L, gold nanoparticles can highly densely be collected. Then, interaction of an electron system (localized surface plasmon or the like) in each gold nanoparticle via electromagnetic field is enhanced and the absorbance spectrum becomes broader. Consequently, light over a wide band can be converted into heat more efficiently than in a yet-to-be-processed solid material or a single fine particle (enhancement of the photothermal effect). Blackening of the region irradiated with light can be concluded as change from which enhancement of the photothermal effect can externally visually be observed.

Attention should be paid to the fact that blackening does not occur simply by generation of fine particles (gold nanoparticles in this example) from a solid material by irradiation with a laser beam. Blackening occurs as a result of highly dense collection of fine particles composed of a solid material generated by irradiation with a laser beam, that is, fine particles as being dispersed while being proximate to one another.

By cutting a microgroove by irradiation with pulsed laser beam L, a surface area of the gold thin film can be increased. It means that an area of a region where generated gold nanoparticles can be dispersed while being proximate to one another (an area where highly densely collected gold nanoparticles can be accommodated, so to speak) can be increased. Therefore, the photothermal effect can further be enhanced by cutting the microgroove.

In succession, an evaluation result of photothermal conversion element 2 (see FIGS. 4 and 5) obtained by laser processing of constantan in a form of a flat plate will be described. Photothermal conversion element 2 had a thickness of 500 µm.

FIG. 15 is a diagram showing a condition for laser processing of another photothermal conversion element 2 in Example in the first embodiment. In this example, laser processing was performed in accordance with five conditions 2A to 2E shown in FIG. 15.

FIG. 16 is a diagram showing an observation result of photothermal conversion element 2 in Example in the first embodiment. Referring to FIG. 16, also in photothermal conversion element 2, highly dense collection of many fine particles of constantan was observed in the region irradiated with pulsed laser beam L. Most constantan particles had a size within a range from several ten nanometers to several hundred nanometers.

Figure 17:
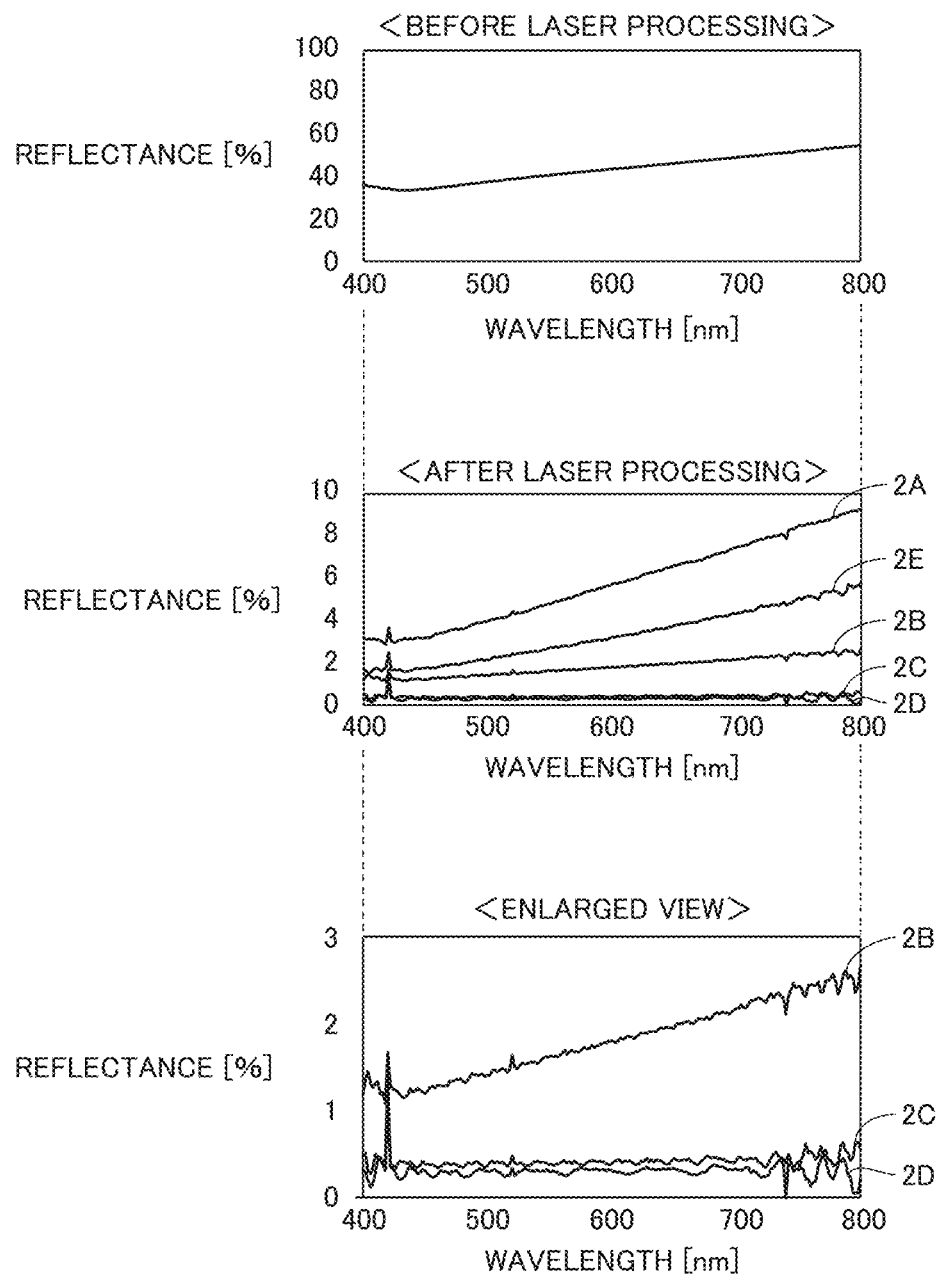
FIG. 17 is a diagram showing measurement results of reflection spectra of photothermal conversion elements manufactured under conditions 2A to 2E.

FIG. 17 is a diagram showing measurement results of reflection spectra of photothermal conversion elements 2 manufactured under conditions 2A to 2E. An upper row in FIG. 17 shows a reflection spectrum before laser processing (an average of measurement results of three samples) for comparison. An intermediate row shows reflection spectra after laser processing. A lower row shows an enlarged view of reflection spectra obtained under conditions 2B to 2D.

A reflectance in the visible range (a wavelength range from 400 nm to 800 nm) of photothermal conversion element 2 yet to be laser-processed was within a range approximately from 40% to 50%. As laser processing is performed, under any of conditions 2A to 2E, a reflectance of photothermal conversion element 2 in the visible range became lower than 10%. Among them, photothermal conversion element 2 laser-processed under condition 2C had an average reflectance (a reflectance averaged in the visible range) of 0.42%. Photothermal conversion element 2 laser-processed under condition 2D had an average reflectance of 0.31%. Blackening of laser-processed photothermal conversion element 2 was also visually observed. Blackening by plating has been known as a method of lowering a reflectance of a metal plate. The average reflectance of constantan blackened by plating is approximately 2%. Therefore, average reflectances obtained under conditions 2C and 2D can be concluded as being significantly lower than the average reflectance that can be achieved by plating. Such significant lowering in reflectance is considered to have been brought about by broadening and peak shift of an absorbance spectrum of highly densely collected constantan particles produced by laser processing, as compared with an absorbance spectrum obtained from a single constantan particle.

Laser output $P_{out}$ under condition 2A is 400 mW, whereas laser output $P_{out}$ under conditions 2B to 2E is 800 mW (see FIG. 15). Since photothermal conversion elements 2 laser-processed under conditions 2B to 2E are lower in average reflectance than photothermal conversion element 2 laser-processed under condition 2A, it can be seen that the average reflectance tends to be lower as laser output $P_{out}$ is higher.

The average reflectances of photothermal conversion elements 2 laser-processed under conditions 2C and 2D are particularly low, and they are lower than 0.5%. Under conditions 2C and 2D, scanning interval D of pulsed laser beam L is narrow (D=50 µm) and the spot diameter of pulsed laser beam L is relatively large (spot height H>50 µm). It can thus be assumed that lowering in average reflectance proceeded because the regions where grain refining of constantan occurred were close to one another and grain refining of constantan proceeded over a wide range.

As set forth above, in the first embodiment, processed region LP is formed in photothermal conversion element 1 or 2 by scanning with pulsed laser beam L. Scanning with pulsed laser beam L can be carried out by using a readily available general laser processing apparatus. As described with reference to FIG. 8, a procedure for making photothermal conversion elements 1 and 2 does not include chemical treatment, and a time period required for making photothermal conversion elements 1 and 2 is also approximately from ten to twenty minutes. Furthermore, the procedure can be concluded as being easier than the procedure for the photothermal conversion element disclosed in Japanese Patent Laying-Open No. 2013-254940 in not requiring production of a metal nanoparticle assembly structure body. Thus, according to the first embodiment, photothermal conversion elements 1 and 2 can be made with a simplified manufacturing method.

Second Embodiment

In a second embodiment, a photothermal power generator capable of generating electric power by using photothermal conversion element 1 or 2 according to the first embodiment will be described.

Figure 18:
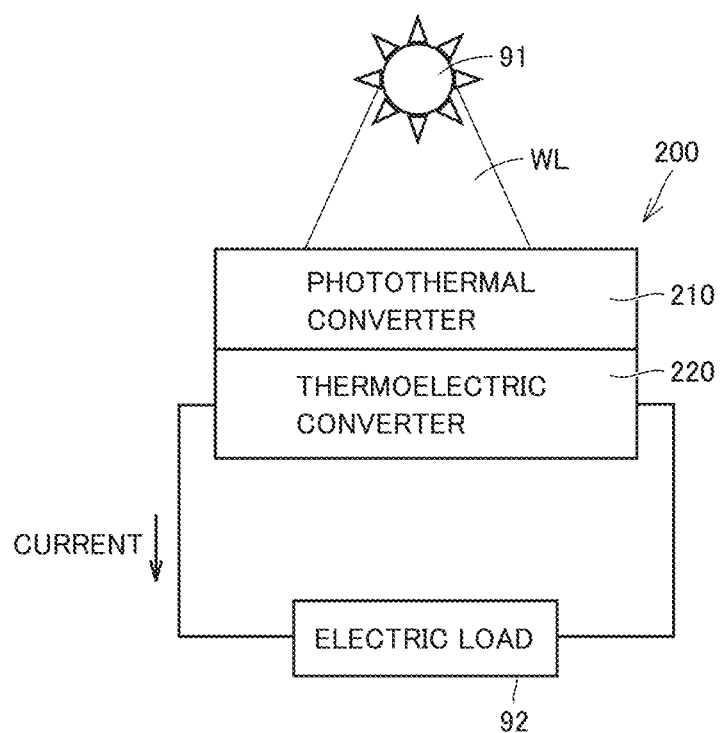
FIG. 18 is a diagram showing an overall configuration of a photothermal power generator according to a second embodiment.

FIG. 18 is a diagram showing an overall configuration of a photothermal power generator according to the second embodiment. Referring to FIG. 18, a white light source 91 is a light source that emits white light WL. White light source 91 is, for example, the sun, however, it may be another light source such as a solar simulator, an incandescent lamp, a white light emitting diode (LED), or a fluorescent lamp. Instead of white light source 91, a monochromatic light source that emits light within a wavelength range from the ultraviolet range to the near infrared range or a light source that emits light within a plurality of wavelength ranges may be employed.

A photothermal power generator 200 generates electric power by using white light WL from white light source 91 and supplies generated electric power to an electric load 92. Photothermal power generator 200 includes a photothermal converter 210 and a thermoelectric converter 220. Photothermal converter 210 generates heat based on the photothermal effect upon receiving white light WL from white light source 91. Thermoelectric converter 220 converts thermal energy generated by photothermal converter 210 into electric energy. In other words, thermoelectric converter 220 generates electric power by using heat from photothermal converter 210. This electric power is supplied to electric load 92.

Though electric load 92 is an electrical circuit, a motor, or the like, it is not particularly limited so long as it is a device that consumes electric power. Though not shown, instead of electric load 92, a power storage device (a secondary battery or the like) in which electric power supplied from photothermal power generator 200 is stored may be connected to photothermal power generator 200. Electric load 92 or the power storage device corresponds to the "load" according to the present disclosure.

Figure 19:
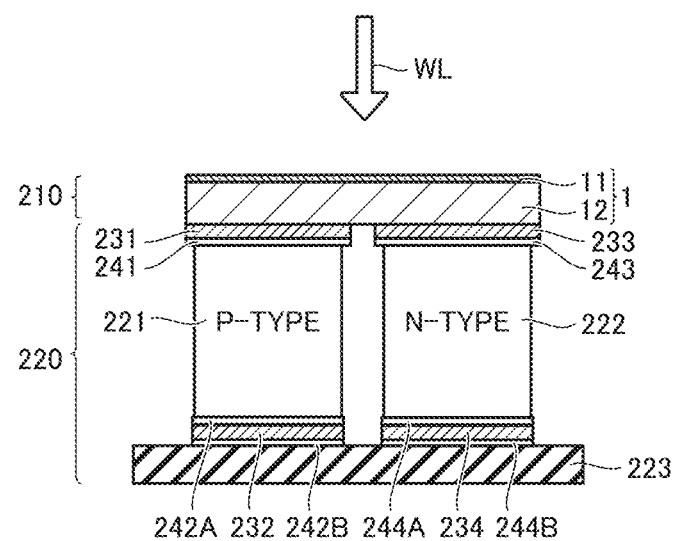
FIG. 19 is a diagram showing an exemplary more detailed configuration of the photothermal power generator.

FIG. 19 is a diagram showing an exemplary more detailed configuration of photothermal power generator 200. Referring to FIG. 19, in this example, photothermal converter 210 includes photothermal conversion element 1. For example, a conductive film (an ITO-PEN film or the like) can be employed for substrate 11 of photothermal conversion element 1.

Thermoelectric converter 220 includes a P-type thermoelectric element 221, an N-type thermoelectric element 222, a heat sink 223, electrodes 231 to 234, and conductive pastes 241, 242A, 242B, 243, 244A, and 244B.

P-type thermoelectric element 221 is thermally and electrically connected to electrode 231 with conductive paste 241 being interposed. Electrode 231 is thermally and electrically connected to substrate 11 (conductive film) of photothermal conversion element 1. P-type thermoelectric element 221 is thermally and electrically connected to electrode 232 with conductive paste 242A being interposed. Though electrode 232 (a first electrode) is thermally connected to heat sink 223 with conductive paste 242B being interposed, it is electrically insulated from heat sink 223.

N-type thermoelectric element 222 is thermally and electrically connected to electrode 233 with conductive paste 243 being interposed, similarly to P-type thermoelectric element 221. Electrode 233 is thermally and electrically connected to substrate 11 of photothermal conversion element 1. N-type thermoelectric element 222 is thermally and electrically connected to electrode 234 with conductive paste 244A being interposed. Though electrode 234 (a second electrode) is thermally connected to heat sink 223 with conductive paste 244B being interposed, it is electrically insulated from heat sink 223.

Heat sink 223 is formed of an insulating material (for example, alumina).

Metal thin film 12 of photothermal conversion element 1 is irradiated with white light WL emitted from white light source 91. Localized surface plasmon resonance of a plurality of fine particles (for example, gold nanoparticles or gold microparticles) thus occurs in processed region LP and heat generation is enhanced (photothermal effect). Heat generated by photothermal conversion element 1 is transmitted to P-type thermoelectric element 221 and N-type thermoelectric element 222. Then, a temperature difference is produced between opposing ends of each of P-type thermoelectric element 221 and N-type thermoelectric element 222. More specifically, in P-type thermoelectric element 221, the temperature on a side of P-type thermoelectric element 221 closer to photothermal conversion element 1 (the side of electrode 231 and conductive paste 241) increases with heating by photothermal conversion element 1. The temperature on a side of P-type thermoelectric element 221 closer to heat sink 223 (the side of conductive paste 242A, electrode 232, and conductive paste 242B) lowers with heat radiation from heat sink 223. This is also applicable to N-type thermoelectric element 222.

The side of P-type thermoelectric element 221 or N-type thermoelectric element 222 closer to photothermal conversion element 1 is also denoted as the "high-temperature side" and the side closer to heat sink 223 is also denoted as the "low-temperature side."

In the inside of P-type thermoelectric element 221, holes are diffused and collected on the low-temperature side. Therefore, in P-type thermoelectric element 221, a potential is higher on the low-temperature side than on the high-temperature side. In the inside of N-type thermoelectric element 222, electrons are diffused toward the low-temperature side. Therefore, in N-type thermoelectric element 222, the potential is lower on the low-temperature side than on the high-temperature side. Consequently, a potential difference is produced between the low-temperature side of P-type thermoelectric element 221 and the low-temperature side of N-type thermoelectric element 222. Therefore, by connecting electric load 92 between electrode 232 and electrode 234, a current can be taken out from electrode 232 to electric load 92. Photothermal power generator 200 is thus configured to convert light energy into thermal energy and to further convert thermal energy into electric energy.

Though FIG. 19 shows a configuration in which thermoelectric converter 220 includes single P-type thermoelectric element 221 and single N-type thermoelectric element 222, thermoelectric converter 220 may include a plurality of sets of P-type thermoelectric element 221 and N-type thermoelectric element 222.

Figure 20:
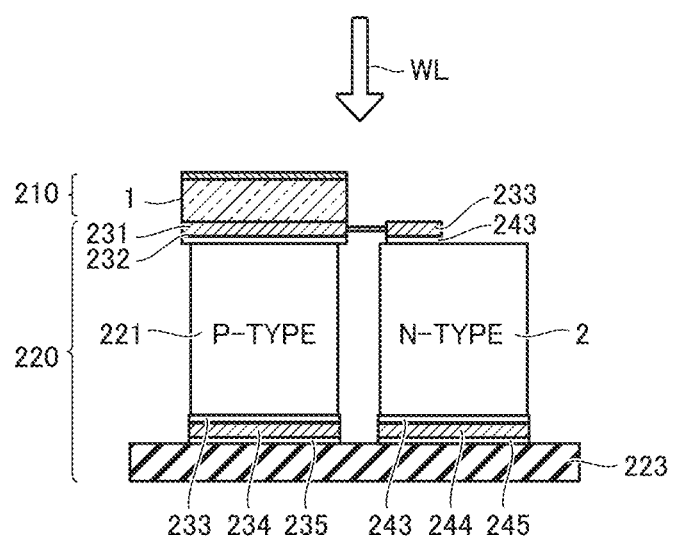
FIG. 20 is a diagram showing another exemplary more detailed configuration of the photothermal power generator.

FIG. 20 is a diagram showing another exemplary more detailed configuration of photothermal power generator 200. Referring to FIG. 20, in this example, photothermal converter 210 includes photothermal conversion element 1 and photothermal conversion element 2 (for example, laser-processed constantan in a form of a flat plate). Photothermal conversion element 1 and photothermal conversion element 2 may thus be combined. Alternatively, photothermal conversion element 2 may be employed instead of photothermal conversion element 1. Electrode 233 connected to photothermal conversion element 2 is electrically connected to electrode 231 connected to photothermal conversion element 1.

In the example shown in FIG. 20, photothermal conversion element 2 also serves as the N-type thermoelectric element. In other words, photothermal conversion element 2 and N-type thermoelectric element 222 are integrally formed to thus implement a "photothermal conversion thermoelectric element." Though photothermal conversion element 2 and N-type thermoelectric element 222 are integrally formed in this example, depending on a material for photothermal conversion element 2, photothermal conversion element 2 and P-type thermoelectric element 221 may integrally be formed.

When photothermal conversion element 1 and N-type thermoelectric element 222 are separately formed as described with reference to FIG. 19, photothermal conversion element 1 and N-type thermoelectric element 222 are thermally connected to each other with substrate 11 being interposed. Substrate 11 is lower in thermal conductivity than most metals. Specifically, constantan has thermal conductivity of 23 [W/m·K], glass has thermal conductivity of 1.0 [W/m·K], and a polyethylene terephthalate (PET) film has thermal conductivity from 0.20 to 0.33 [W/m·K]. Therefore, the integrally formed photothermal conversion element 2 and N-type thermoelectric element without including substrate 11 can achieve transmission of thermal energy more efficiently than separately formed photothermal conversion element 1 and N-type thermoelectric element 222.

Simulated Photothermal Conversion

How much the temperature of photothermal conversion element 2 included in photothermal power generator 200 increased from a room temperature when photothermal power generator 200 was irradiated with white light WL (sunlight) was estimated. Results will be described.

Figure 21:
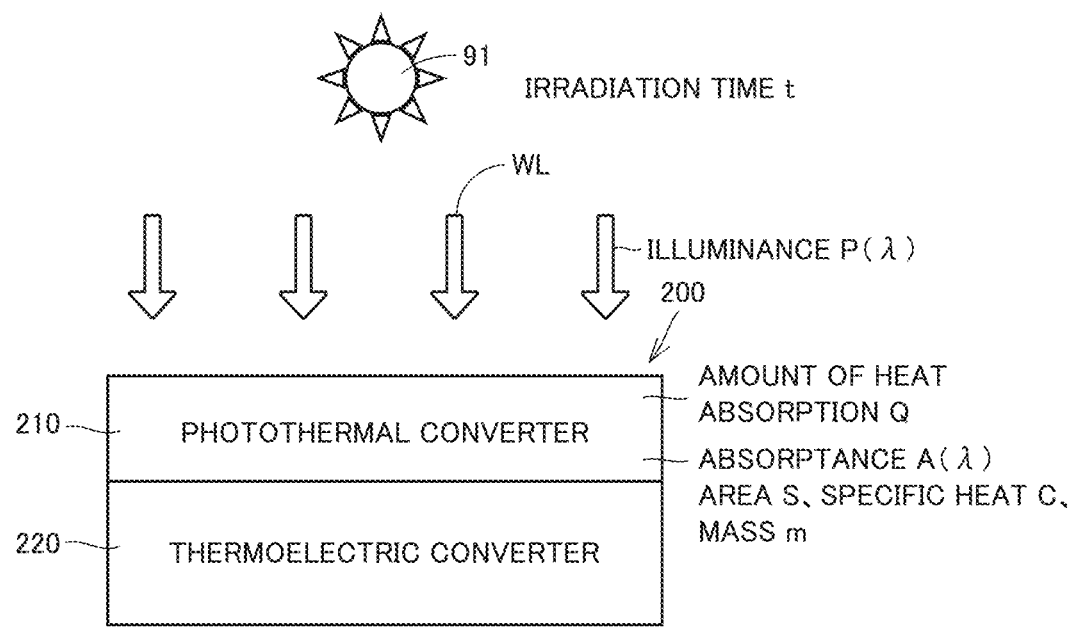
FIG. 21 is a diagram for illustrating a condition for simulation of a temperature increase amount by a photothermal effect of a photothermal conversion element 2.

FIG. 21 is a diagram for illustrating a condition for simulation of a temperature increase amount by the photothermal effect of photothermal conversion element 2. Referring to FIG. 21, t [s] represents an irradiation time with white light WL from white light source 91 and P(λ) [W/m²] represents illuminance of white light WL (sunlight in this example). S [m²] represents an area of an irradiation surface (an area of processed region LP) irradiated with white light WL in photothermal conversion element 2. λ[m] represents a wavelength of white light WL.

A (λ) [%] represents an absorptance of white light WL by photothermal conversion element 2. Absorptance A is expressed as A=1−R−T using a reflectance R and a transmittance T. When photothermal conversion element 2 is composed of constantan in the form of the flat plate, transmittance T is T≈0, and hence absorptance A can be approximated to A≈1−R. Therefore, absorptance A can be calculated from a measurement result (see FIG. 17) of reflectance R of photothermal conversion element 2.

In this case, an amount of heat absorption Q [J] by photothermal conversion element 2 is calculated in accordance with an expression (1) below.

[Expression 1]

$$Q = \left(\sum_\lambda A(\lambda) \times P(\lambda)\right) \times S \times t \quad (1)$$

A temperature increase amount $T_{up}$ [K] of photothermal conversion element 2 with the room temperature (25° C.) being defined as the reference can be calculated in an expression (2) below, where C [J/k·g] represents specific heat of photothermal conversion element 2 and m [g] represents a mass of photothermal conversion element 2.

$$T_{up} = Q/(C \times m) \quad (2)$$

In the present simulation, an irradiation time with white light WL was set to t=120 [s]. Area S of the irradiation surface of photothermal conversion element 2 was set to S=3.2×10⁻⁴ [m²]. Specific heat C of photothermal conversion element 2 was set to C=0.41 [J/g·K], and mass m of photothermal conversion element 2 was set to m=1.4 [g].

Figure 22:
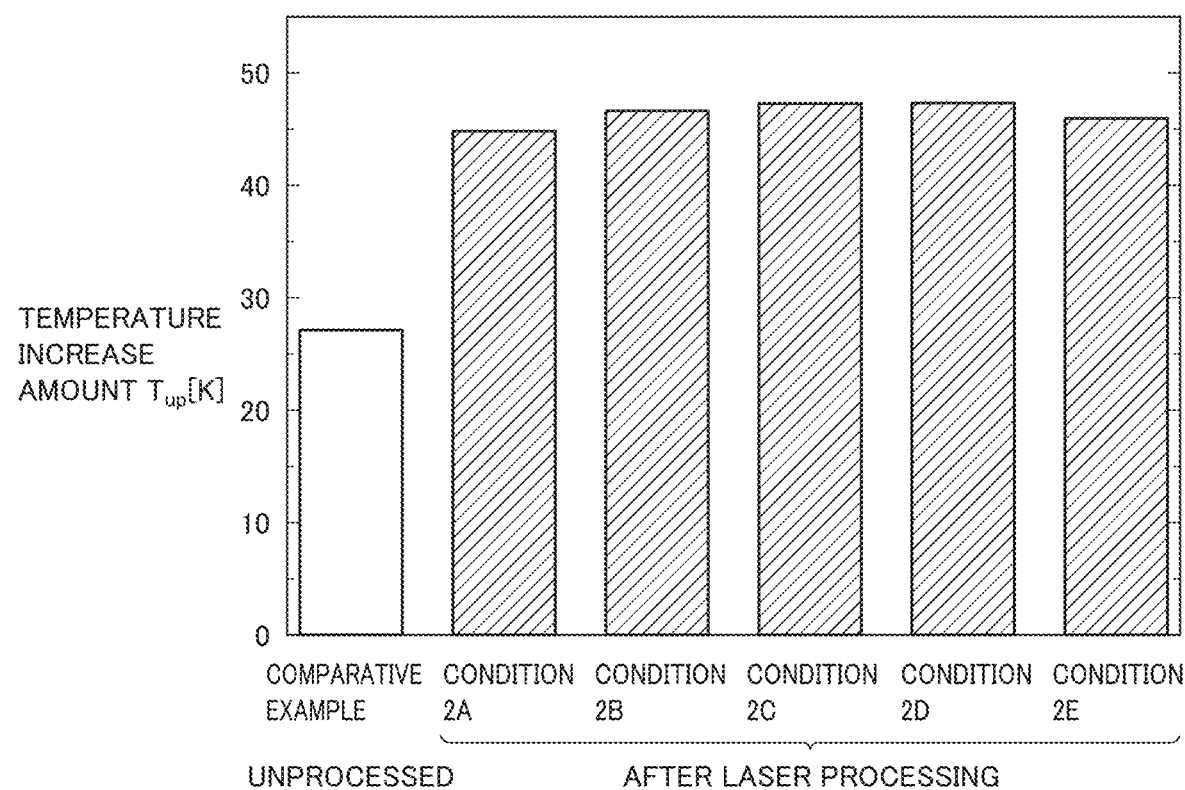
FIG. 22 is a diagram showing a simulation result of the temperature increase amount of the photothermal conversion element by the photothermal effect.

FIG. 22 is a diagram showing a simulation result of temperature increase amount $T_{up}$ of photothermal conversion element 2. Referring to FIG. 22, the figure shows on the left that a calculation result of the temperature increase amount in a yet-to-be-processed constantan substrate (a substrate not provided with processed region LP) as a comparative example was approximately 27° C. In contrast, in laser-processed photothermal conversion elements 2, temperature increase amount $T_{up}$ was equal to or larger than 45° C. under any of laser processing conditions 2A to 2E (see FIG. 15).

An example using photothermal conversion element 2 is described with reference to FIGS. 21 and 22. Instead of photothermal conversion element 2, photothermal conversion element 1 (see FIGS. 2 and 3) may be employed. Heat can highly efficiently be generated owing to the photothermal effect also by irradiation with light, of metal thin film 12 provided in photothermal conversion element 1.

Simulated Photothermoelectric Conversion

In succession, a simulation result of generated electric power (output power) in photothermal power generator 200 when photothermal power generator 200 is irradiated with white light WL (sunlight) will be described.

FIG. 23 is a diagram for illustrating a condition for simulating an amount of electric power generated by photothermoelectric conversion (photothermal conversion and thermoelectric conversion) in photothermal power generator 200. Referring to FIG. 23, characteristics of a material for P-type thermoelectric element 221 and N-type thermoelectric element 222 were set as below.

A Seebeck coefficient S(T) of N-type thermoelectric element 222 was set to S(T)=−40×10⁻⁶ to −36×10⁻⁶ [V/K]. Electrical resistivity ρ was set to ρ=0.44×10⁻⁶ to 0.46×10⁻⁶ [Ω·m]. Thermal conductivity κ was set to κ=23 to 27 [W/m$^{SM}$K]. This thermal conductivity κ is higher by two orders of magnitude than thermal conductivity (≈0.20 to 0.33 [W/m·K]) of the PET film.

Similarly also for P-type thermoelectric element 221, Seebeck coefficient S(T) was set to S(T)=1.7×10⁻⁶ to 2.4× 10⁻⁶ [V/K]. Electrical resistivity ρ was set to ρ=17×10⁻⁶ to 24×10⁻⁶ [n·m]. Thermal conductivity κ was set to κ=400 [W/m·K].

In connection with a thermal condition, a temperature of each of P-type thermoelectric element 221 and N-type thermoelectric element 222 was calculated from temperature increase amount $T_{up}$ described with reference to FIG. 22 (temperature=room temperature+temperature increase amount $T_{up}$). A heat flux provided to and from P-type thermoelectric element 221 and N-type thermoelectric element 222 was calculated by dividing amount of heat absorption Q (see the expression (1)) by area S of the irradiation surface irradiated with white light WL.

Each of P-type thermoelectric element 221 and N-type thermoelectric element 222 was in a form of a parallelepiped. A cross-sectional area of the parallelepiped (=area S) was set to 1×3 [mm²] and a height of the parallelepiped was set to 4 [mm].

Figure 24:
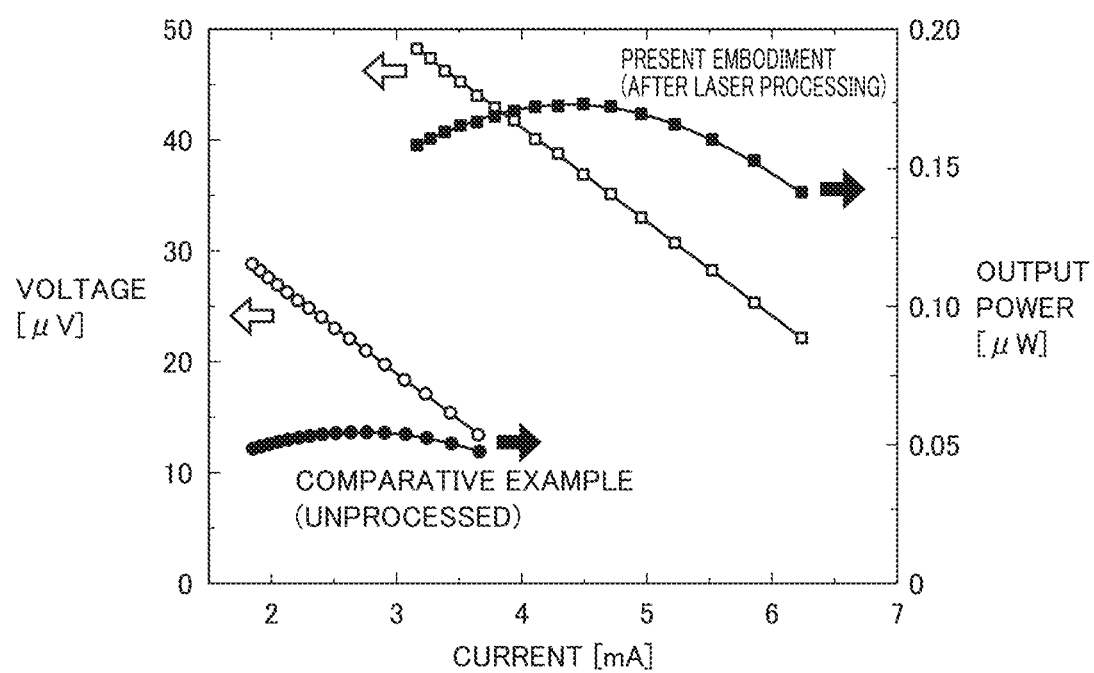
FIG. 24 is a diagram showing a simulation result of generated electric power in the photothermal power generator.

FIG. 24 is a diagram showing a simulation result of an amount of electric power generated in photothermal power generator 200. In FIG. 24, the abscissa represents an output current from photothermal power generator 200. The left ordinate represents an output voltage from photothermal power generator 200 and the right ordinate represents output power from photothermal power generator 200. As shown in FIG. 24, a result for photothermal power generator 200 is that output power thereof was at least three times as high as that of the unprocessed constantan substrate (comparative example).

As set forth above, with photothermal power generator 200 according to the second embodiment, by using photothermal converter 210 including photothermal conversion element 2 (which may be photothermal conversion element 1) subjected to laser processing, in comparison with the comparative example in which laser processing is not performed, light can highly efficiently be converted into heat and heat generated by photothermal conversion element 2 can be increased (see FIG. 22). Furthermore, by conversion of increased heat into electric power by thermoelectric converter 220, generated electric power can be increased (see FIG. 24). According to the second embodiment, light can thus highly efficiently be converted into electricity.

Third Embodiment

In a third embodiment, a microscopic object collection system that collects a plurality of microscopic objects contained in a liquid by using photothermal conversion element 1 according to the first embodiment will be described. In an example below, beads (microbeads) having a size of the micrometer order are collected.

Figure 25:
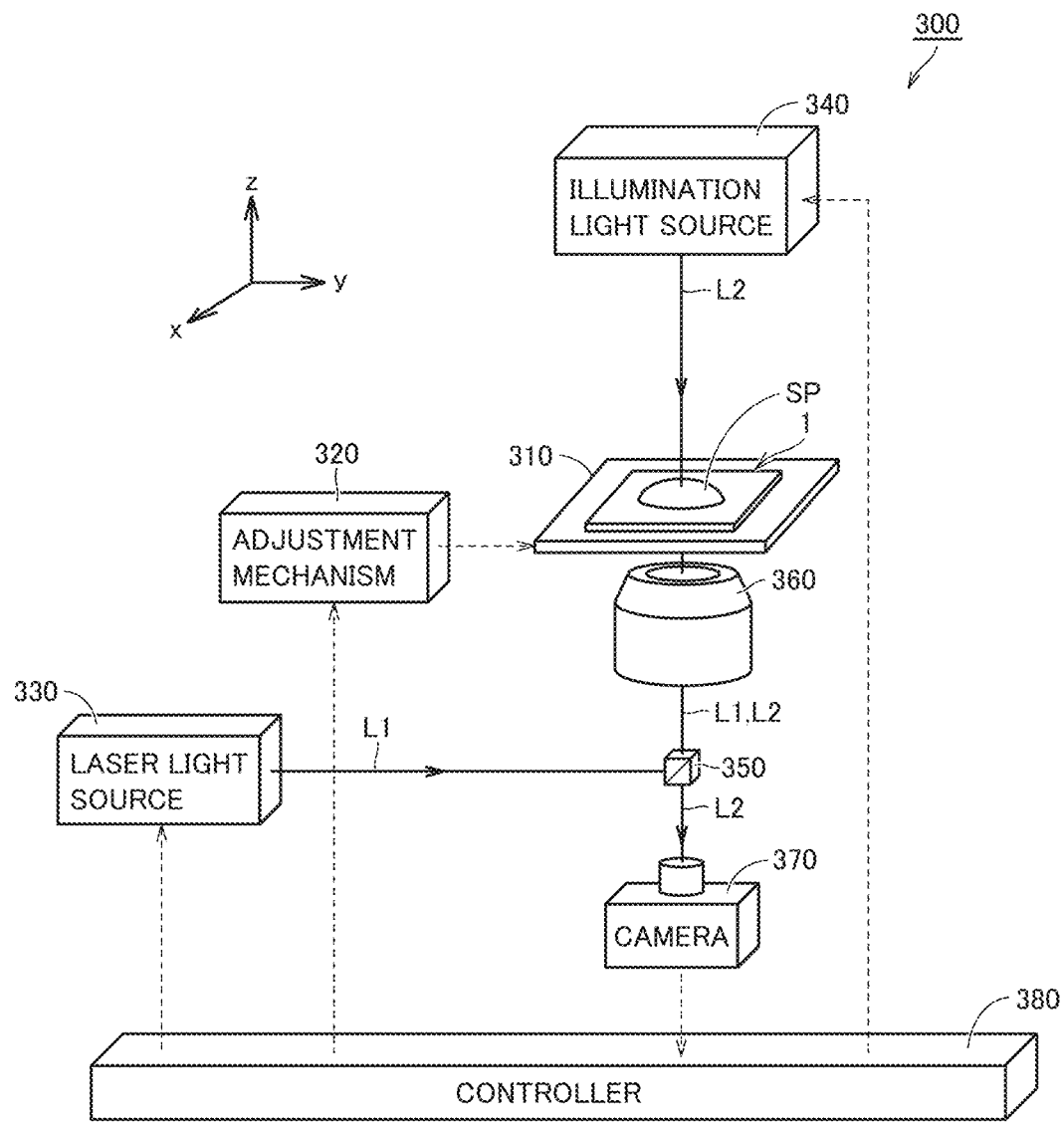
FIG. 25 is a diagram showing an overall configuration of a microscopic object collection system according to a third embodiment.

FIG. 25 is a diagram showing an overall configuration of a microscopic object collection system according to the third embodiment. Referring to FIG. 25, a collection system 300 includes an XYZ-axis stage 310, an adjustment mechanism 320, a laser light source 330, an illumination light source 340, an optical component 350, an objective lens 360, a camera 370, and a controller 380.

XYZ-axis stage 310 is configured to hold photothermal conversion element 1. XYZ-axis stage 310 corresponds to the "holder" according to the present disclosure.

Figure 26:
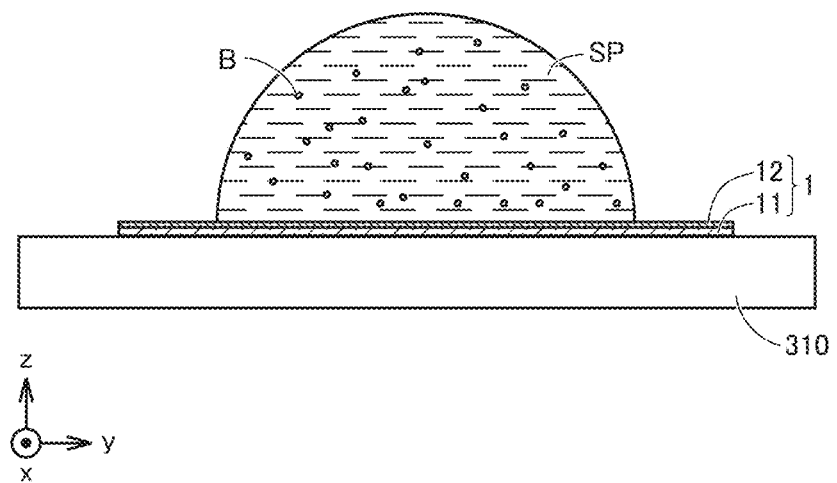
FIG. 26 is an enlarged view of the photothermal conversion element held on an XYZ-axis stage.

FIG. 26 is an enlarged view of photothermal conversion element 1 held on XYZ-axis stage 310. As shown in FIG. 26, a sample SP is dropped onto photothermal conversion element 1. Microbeads B are dispersed in sample SP. In one example (see FIG. 27), microbead B is composed of polystyrene, and microbead B has a diameter of 1 μm. A dispersion medium of sample SP is pure water.

Referring back to FIG. 25, adjustment mechanism 320 adjusts a position in the x direction, the y direction, and the z direction of XYZ-axis stage 310 in accordance with an instruction from controller 380. In the present embodiment, a position of objective lens 360 is fixed. Therefore, relative positional relation between photothermal conversion element 1 and objective lens 360 is adjusted by adjusting the position of XYZ-axis stage 310. Adjustment mechanism 320 may adjust the position of objective lens 360 with respect to fixed photothermal conversion element 1.

Laser light source 330 emits a laser beam L1 in accordance with an instruction from controller 380. Laser beam L1 has a wavelength (1064 nm in the present embodiment), for example, within the near infrared range. Laser light source 330 corresponds to the "light source" according to the present disclosure.

Illumination light source 340 emits white light L2 for illumination of sample SP on photothermal conversion element 1 in accordance with an instruction from controller 380. By way of example, a halogen lamp can be employed as illumination light source 340.

Optical component 350 includes, for example, a mirror, a dichroic mirror, a prism, and an optical fiber. An optical system of collection system 300 is adjusted such that laser beam L1 from laser light source 330 is guided to objective lens 360 by optical component 350.

Objective 360 focuses laser beam L1 from laser light source 330 on photothermal conversion element 1 is irradiated with light focused by objective lens 360. Objective 360 is used also for taking in white light L2 emitted from illumination light source 340 to photothermal conversion element 1. White light L2 taken in by objective lens 360 is guided to camera 370 by optical component 350.

Camera 370 takes an image of sample SP on photothermal conversion element 1 irradiated with white light L2 in accordance with an instruction from controller 380 and provides the taken image to controller 380.

Controller 380 is implemented by a microcomputer including a processor such as a CPU, a memory such as a ROM and a RAM, and an input and output port, although none of them is shown. Controller 380 controls each device (adjustment mechanism 320, laser light source 330, illumination light source 340, and camera 370) within collection system 300.

A thickness of metal thin film 12 is set such that processed region LP is transmissive to laser beam L1. In an example below, a gold thin film had a thickness of 100 nm. With processed region LP thus being light transmissive, processed region LP can be irradiated with laser beam L1 upward from below processed region LP as shown in FIG. 25, and processed region LP can be observed from below with camera 270.

Figure 27:
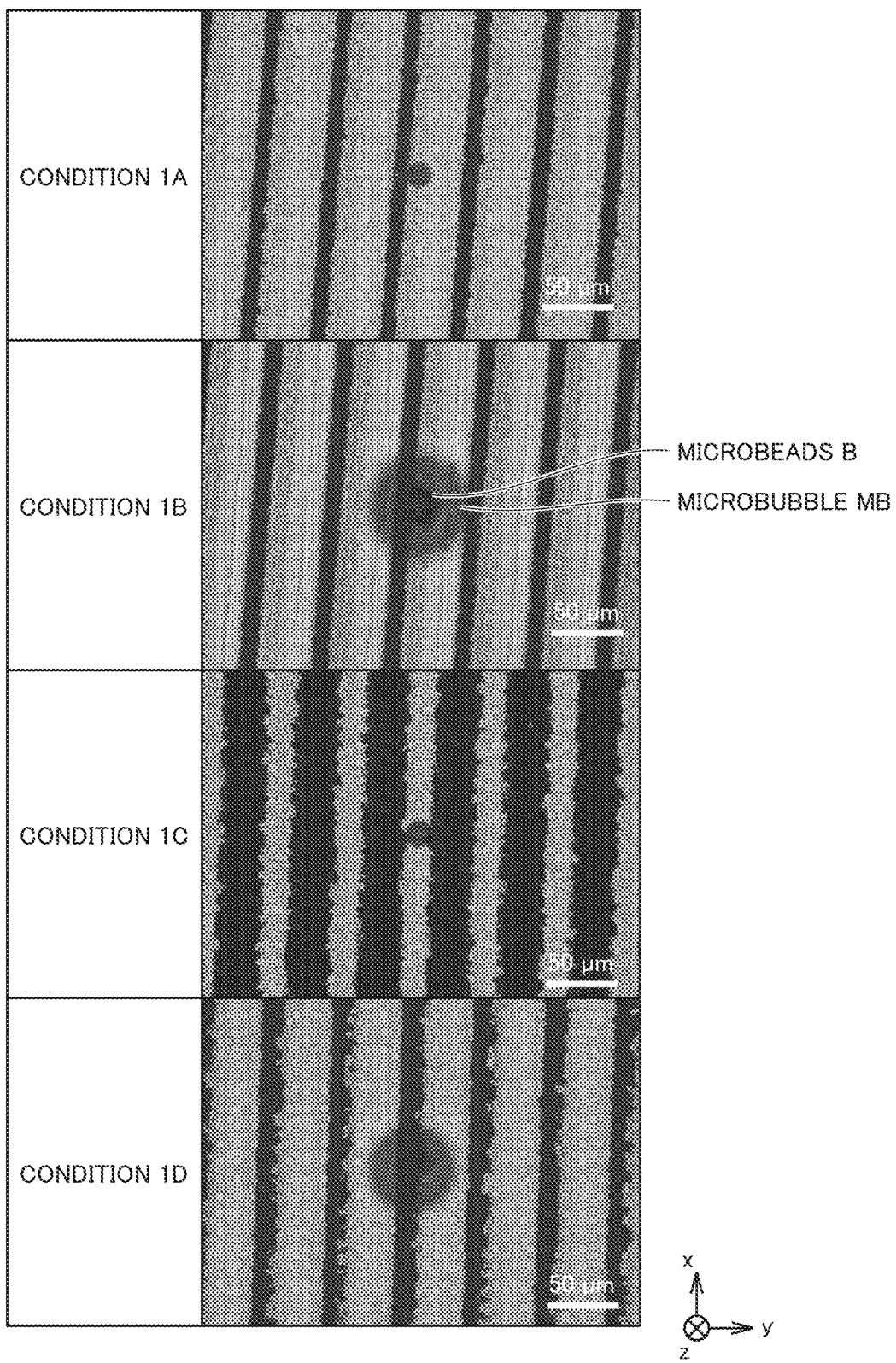
FIG. 27 shows a photograph of a sample in irradiation with a laser beam.

FIG. 27 shows a photograph of sample SP in irradiation with laser beam L1. Photothermal conversion elements made under the four laser processing conditions described with reference to FIGS. 9 and 10 were prepared as photothermal conversion element 1. Output $P_{out}$ of laser beam L1 emitted to photothermal conversion element 1 was 50 mW. A magnification of objective lens 360 was 40×. An irradiation time with laser beam L1 was set to one hundred seconds.

In a region between black lines where gold nanoparticles (gold microparticles may also be produced) had been observed as a result of irradiation with pulsed laser beam L, production of a microbubble MB could be observed by irradiating with laser beam L1. Collection of microbeads B toward microbubble MB was observed. A collection mechanism of microbeads B is described as below.

Figure 28:
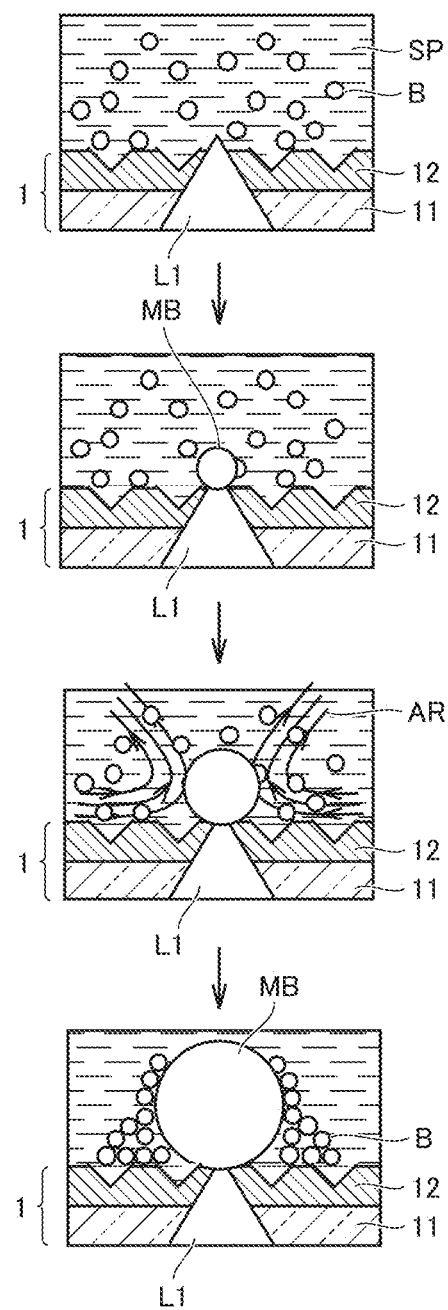
FIG. 28 is a conceptual diagram for illustrating a mechanism of microbead collection.

FIG. 28 is a conceptual diagram for illustrating a collection mechanism of microbeads B. Referring to FIG. 28, as emission of laser beam L1 is started, a region in the vicinity of a laser spot is locally heated owing to the photothermal effect. With increase in temperature of a liquid (sample SP) around the heated region, microbubble MB is produced. Microbubble MB grows over time in the vicinity of the laser spot.

As a position is closer to the laser spot, a temperature of the liquid is higher. In other words, a temperature gradient is produced in the liquid as a result of irradiation with light. Regular heat convection is steadily produced in the liquid due to this temperature gradient. A direction of heat convection is a direction once heading toward the laser spot and thereafter deviating from the laser spot as shown with an arrow AR. Therefore, microbeads B are carried over heat convection toward the laser spot.

A "stagnation region" where a flow velocity of convection is zero is produced in a form of a ring between microbubble MB and metal thin film 12. As heat convection is held back by microbubble MB, some of microbeads B carried toward the laser spot build up in the vicinity of the stagnation region. Consequently, microbeads B are collected in the vicinity of the laser spot. For example, WO2017/195872 or Japanese Patent Laying-Open No. 2017-202446 can be referred to for details of the collection mechanism of microbeads B.

As set forth above, in the third embodiment, owing to the photothermal effect of photothermal conversion element 1, microbubble MB is produced and convection is produced. Owing to this convection, microbeads B dispersed in sample SP are collected in the stagnation region produced below microbubble MB. By using this mechanism, many microbeads B can highly efficiently be collected.

It should be understood that the embodiments disclosed herein are illustrative and non-restrictive in every respect. The scope of the present disclosure is defined by the terms of the claims rather than the description of the embodiments above and is intended to include any modifications within the scope and meaning equivalent to the terms of the claims.

The invention claimed is:
1. A method of manufacturing a photothermal conversion element comprising:
providing a solid material; and
forming a processed region processed by irradiation of the solid material with a focused laser beam, wherein:
the forming includes grain refining the solid material to blacken the processed region by a collection of a plurality of fine particles composed of the solid material, the plurality of fine particles produce localized surface plasmon resonance on a surface of each of the plurality of fine particles by irradiation with light, the forming includes scanning with the focused laser beam to provide, by cutting, a plurality of micro-grooves in the processed region, and the scanning includes scanning the focused laser beam with a scanning interval and a spot height such that resultant average reflectance in a visible range of the processed region is 0.42% or less.

2. The method according to claim 1, wherein the solid material includes at least one of a thermoelectric material that exhibits a thermoelectric effect and a metal thin film.

3. The method according to claim 2, wherein the solid material includes gold, silver, or copper nickel alloy.

4. The method according to claim 1, wherein the processed region enhances, compared to an unprocessed region of the solid material, a photothermal effect caused by the localized surface plasmon resonance of the plurality of fine particles.

5. The method according to claim 1, wherein the scanning includes scanning the focused laser beam with the scanning interval and the spot height such that the resultant average reflectance in visible range of the processed region is 0.31% or less.

* * * * *